US011374364B2

(12) United States Patent
Sasada et al.

(10) Patent No.: US 11,374,364 B2
(45) Date of Patent: Jun. 28, 2022

(54) SHIELD SHELL, CONNECTOR, MATING CONNECTOR, CONNECTION STRUCTURE OF CONNECTORS, AND METHOD FOR MANUFACTURING CONNECTOR

(71) Applicant: HOSIDEN CORPORATION, Yao (JP)

(72) Inventors: Kosuke Sasada, Yao (JP); Takayuki Nagata, Yao (JP); Hayato Kondo, Yao (JP)

(73) Assignee: Hosiden Corporation, Yao (JP)

( * ) Notice: Subject to any disclaimer, the term of this patent is extended or adjusted under 35 U.S.C. 154(b) by 48 days.

(21) Appl. No.: 17/040,712

(22) PCT Filed: Mar. 25, 2019

(86) PCT No.: PCT/JP2019/012404
§ 371 (c)(1),
(2) Date: Sep. 23, 2020

(87) PCT Pub. No.: WO2019/202918
PCT Pub. Date: Oct. 24, 2019

(65) Prior Publication Data
US 2021/0013680 A1    Jan. 14, 2021

(30) Foreign Application Priority Data

Apr. 16, 2018 (JP) .............................. JP2018-078622
Jul. 30, 2018 (JP) .............................. JP2018-142465

(51) Int. Cl.
*H01R 13/6581* (2011.01)
*H01R 13/639* (2006.01)
(Continued)

(52) U.S. Cl.
CPC ....... *H01R 13/6581* (2013.01); *H01R 13/627* (2013.01); *H01R 13/6273* (2013.01); *H01R 13/639* (2013.01); *H01R 43/20* (2013.01)

(58) Field of Classification Search
None
See application file for complete search history.

(56) References Cited

U.S. PATENT DOCUMENTS

| 7,833,056 | B1 | 11/2010 | Lee et al. |
| 2008/0242149 | A1 | 10/2008 | Konno et al. |

(Continued)

FOREIGN PATENT DOCUMENTS

| CN | 202906112 U | 4/2013 |
| CN | 205039345 U | 2/2016 |

(Continued)

OTHER PUBLICATIONS

First Notification of Office Action, issued by CNIPA, for Chinese Patent Application No. 201980025995.8, dated Jul. 2, 2021, with translation, 21 pages.

(Continued)

*Primary Examiner* — Oscar C Jimenez
(74) *Attorney, Agent, or Firm* — Kilyk & Bowersox, P.L.L.C.

(57) ABSTRACT

The invention provides a shield shell that allows easy insertion of a circuit board or other insulator into the shield shell. A shield shell 300 includes a shell body 310 and first and second position restrictors 320a and 320b. The first position restrictor 320a is provided at an edge portion 315 of an insertion port 310 of the shell body 310 and is located inside the insertion port 315. The second position restrictor 320b is provided in the shell body 310 so as to oppose the first position restrictor 320b with a spacing in a Z-Z' direction. A distance in the Z-Z' direction from the first position restrictor 320a to the second position restrictor 320b is substantially equal to, or slightly larger than, a distance in the Z-Z' direction from a first face 101 to a second face 102 of a circuit board 100. When the circuit board 100 is inserted into the shell body 310 through the (Continued)

insertion port 315, the first position restrictor 320*a* and the second position restrictor 320*b* are abuttable on the first face 101 and the second face 102, respectively, of the circuit board 100.

19 Claims, 22 Drawing Sheets

(51) Int. Cl.
*H01R 13/627* (2006.01)
*H01R 43/20* (2006.01)

(56) References Cited

U.S. PATENT DOCUMENTS

| | | | |
|---|---|---|---|
| 2013/0084745 A1 | 4/2013 | Siahaan et al. | |
| 2015/0229073 A1 | 8/2015 | Katayanagi | |
| 2016/0154185 A1 | 6/2016 | Mori et al. | |
| 2017/0133806 A1 | 5/2017 | Wang et al. | |
| 2018/0138646 A1* | 5/2018 | Chuang | H05K 1/117 |

FOREIGN PATENT DOCUMENTS

| | | |
|---|---|---|
| CN | 206340697 U | 7/2017 |
| JP | 2007-328018 A | 12/2007 |
| JP | 2008-251248 A | 10/2008 |
| JP | 2014-534564 A | 12/2014 |
| JP | 2015-153609 A | 8/2015 |
| JP | 2016-106343 A | 6/2016 |
| WO | 2014/148134 A1 | 9/2014 |

OTHER PUBLICATIONS

International Search Report (Form PCT/ISA/210) for International Patent Application No. PCT/JP2019/012404, issued from the Japan Patent Office, dated Jun. 5, 2019, 5 pages.
Written Opinion of the International Searching Authority (Form PCT/ISA/237) for International Patent Application No. PCT/JP2019/012404, issued from the Japan Patent Office, dated Jun. 5, 2019, 5 pages.
Extended European Search Report for European Patent Application No. 19789322.5, issued from the European Patent Office, dated Apr. 15, 2021, 14 pages.
2nd Notification of Office Action, issued by CNIPA, for Chinese Patent Application No. 201980025995.8, dated Dec. 9, 2021, with translation, 17 pages.

* cited by examiner

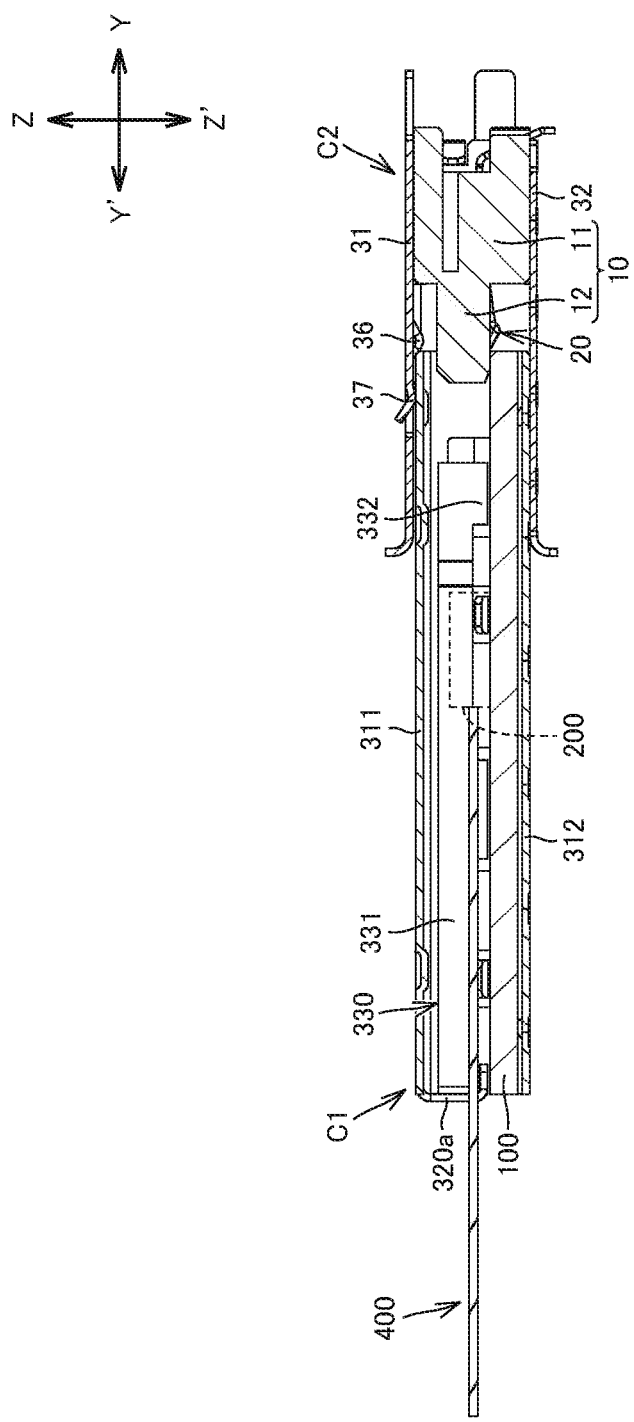

SHIELD SHELL, CONNECTOR, MATING CONNECTOR, CONNECTION STRUCTURE OF CONNECTORS, AND METHOD FOR MANUFACTURING CONNECTOR

BACKGROUND OF THE INVENTION

Technical Field

The invention relates to a shield shell, a connector, a mating connector, a connection structure of connectors, and a method for manufacturing a connector.

Background Art

A conventional connector is described in Patent Literature identified below. This conventional connector includes a shell and a circuit board mounted with an electronic component for opto-electronic conversion. The shell includes a pair of side plates, each of which is provided with a plurality of cut-and-raised pieces arranged at spaced intervals along an insertion direction. The circuit board is inserted in between the cut-and-raised piece and an upper plate of the shell along the insertion direction through a rear opening of the shell to be housed in the shell.

Citation List: Patent Literature

Patent Literature 1: JP 2007-328018 A

SUMMARY OF INVENTION

Technical Problem

The cut-and-raised pieces of each side plate include a rear cut-and-raised piece closest to the rear opening of the shell. The rear cut-and-raised pieces are located inside the shell. When trying to insert the circuit board in between the rear cut-and-raised pieces and the upper plate of the shell through the rear opening of the shell, if the circuit board advancing between the rear opening and the rear cut-and-raised pieces is displaced from the upper plate, the circuit board may collide with the rear cut-and-raised pieces. Such an arrangement of the conventional connector requires care not to displace the circuit board away from the upper plate when inserting the circuit board into the shell. It is thus difficult to insert the circuit board into the shell.

The invention provides a shield shell, a connector, a mating connector, a connection structure of connectors, and a method for manufacturing a connector, each of which allows easy insertion of a circuit board or other insulator into the shield shell.

Solution to Problem

To solve the above problem, a shield shell according to one aspect of the invention includes a shell body and first and second position restrictors. The shell body includes an insertion port and an edge portion of the insertion port, the insertion port opening to one side in a first direction. The shell body is configured to receive an insulator through the insertion port. The first position restrictor is provided at the edge portion of the shell body and located inside the insertion port. The second position restrictor is provided in the shell body so as to oppose the first position restrictor with a spacing therebetween in a second direction, the second direction being substantially orthogonal to the first direction. A distance in the second direction from the first position restrictor to the second position restrictor is substantially equal to, or slightly larger than, a distance in the second direction from a first face to a second face of the insulator, the second face being an opposite face to the first face. The first and second position restrictors are respectively abuttable on the first and second faces of the insulator when the insulator is inserted into the shell body through the insertion port.

In the shield shell of this aspect, when the insulator is inserted into the insertion port of the shell body, the first position restrictor at the edge portion of the insertion port of the shell body and the second position restrictor opposing the first position restrictor make abutment with the first and second faces, respectively, of the insulator to restrict the position of the insulator. This arrangement facilitates the insertion of the insulator into the shell body.

The shield shell may further include a latch arm including an arm and a third position restrictor. The arm may extend from the first position restrictor, or from the edge portion of the shell body, to the other side in the first direction inside the shell body. The third position restrictor may be provided at the arm and at least partly located inside the shell body. In this case, the third position restrictor may be abuttable on the first face of the insulator inside the shell body when the insulator is inserted into the shell body through the insertion port.

In the shield shell of this aspect, when the insulator is inserted through the insertion port into the shell body, the position of the insulator is restricted by the abutment of the first and second position restrictors, and by the abutment of the third position restrictor of the latch arm inside the shell body. Thus, the insulator is less likely to be slanted when being inserted into the shell body.

The first position restrictor may be a piece member extending from the edge portion of the shell body into the insertion port. Alternatively, the first position restrictor may include an attaching portion and a restrictor body. The attaching portion may be attached to the edge portion of the shell body. The restrictor body may be a piece member extending from the attaching portion into the insertion port.

The second position restrictor may be a portion of the edge portion of the shell body that opposes the first position restrictor with a spacing therebetween in the second direction. Alternatively, the second position restrictor may be a piece member extending from the edge portion of the shell body into the insertion port. Still alternatively, the second position restrictor may include an attaching portion and a restrictor body. The attaching portion may be attached to the edge portion of the shell body. The restrictor body may be a piece member extending from the attaching portion into the insertion port.

The shield shell of any of the above aspects may further includes a fourth position restrictor. The fourth position restrictor may be provided in the shell body, the fourth position restrictor being located inside the shell body and on the other side in the first direction with respect to the first position restrictor. The fourth position restrictor may be abuttable on the first face of the insulator inside the shell body when the insulator is inserted into the shell body through the insertion port.

In the shield shell of this aspect, when the insulator is inserted into the insertion port, the position of the insulator is restricted by the abutment of the first and second position restrictors, and by the abutment of the fourth position restrictor inside the shell body. Thus, the insulator is less likely to be slanted when being inserted into the shell body.

The shield shell of any of the above aspects may further include a fixing portion. The fixing portion may be formed by cutting out a portion of the shell body on the other side in the first direction with respect to the first position restrictor and bending the cut-out portion to an inside of the shell body. The fixing portion may be configured to fit into a fitting recess in the insulator. In the shield shell of this aspect, the fixing portion fits into the fitting recess of the insulator housed in the shell body so as to prevent inadvertent detachment of the insulator from the shell body. It should be noted that the fourth position restrictor may serve as the fixing portion.

The shield shell of any of the above aspects may further include a fifth position restrictor. The fifth position restrictor may be provided in the shell body and located on the other side in the first direction with respect to the second position restrictor. The fifth position restrictor may be abuttable on the second face of the insulator inside the shell body when the insulator is inserted into the shell body through the insertion port. In the shield shell of this aspect, when the insulator is inserted into the insertion port, the position of the insulator is restricted by the abutment of the first and second position restrictors, and by the abutment of the fifth position restrictor inside the shell body. Thus, the insulator is less likely to be slanted when being inserted into the shell body.

A connector of one aspect of the invention may preferably include at least one electronic component, an insulator with the at least one electronic component mounted thereon, and the shield shell of any of the above aspects. The insulator may be a circuit board, for example.

A connector of another aspect of the invention includes a second shield shell configured to receive a first shield shell in the first direction. The first shell is the shield shell of the connector of any of the above aspects. The second shield shell includes an engagement hole and a half-lock spring. When the first shield shell is inserted into the second shield shell, the third position restrictor of the latch arm fits into the engagement hole, and substantially simultaneously the half-lock spring is locked with a lock portion of the first shield shell.

The connector of this aspect generates a click feel by the locking of the half-lock spring with the lock portion substantially at the same time as the insertion of the third position restrictor of the latch arm into the engagement hole. This click feel allows workers to recognize that the connectors have been connected together.

The second shield shell may further include a grounding contact spring. While the first shield shell is being inserted into the second shield shell, the half-lock spring may make elastic contact with the first shield shell from when contacting the first shield shell until when locked with the lock portion. The grounding contact spring may be configured to make elastic contact with the first shield shell before the half-lock spring makes contact with the first shield shell. A load applied to the first shield shell when the grounding contact spring makes elastic contact with the first shield shell may be smaller than a load applied to the first shield shell when the half-lock spring makes elastic contact with the first shield shell.

The connector of the other aspect may further include an insulative body housed in the second shield shell and at least one terminal held by the insulative body. The at least one terminal may be configured to make elastic contact with the insulator housed in the first shield shell substantially at a same time as the half-lock spring makes elastic contact with the first shield shell.

The second shield shell may include a lock portion in place of the half-lock spring, and the first shield shell may include a half-lock spring in place of the lock portion. In this variant, when the first shield shell is inserted into the second shield shell, the engagement hole may fittingly receive the third position restrictor of the latch arm, and substantially simultaneously the half-lock spring of the first shield shell is locked with the lock portion.

In this variant connector, the second shield shell may further include a grounding contact spring. While the first shield shell is being inserted into the second shield shell, the half-lock spring may be in elastic contact with the second shield shell from when contacting the second shield shell until when locked with the lock portion. The grounding contact spring may be configured to come into in elastic contact with the first shield shell before the half-lock spring makes contact with the second shield shell. A load applied to the first shield shell when the grounding contact spring makes elastic contact with the first shield shell may be smaller than a load applied to the second shield shell when the half-lock spring makes elastic contact with the second shield shell.

The above variant connector may further include an insulative body housed in the second shield shell and at least one terminal held by the insulative body. In this case, the at least one terminal may be configured to make elastic contact with the insulator housed in the first shield shell substantially at a same time as the half-lock spring makes elastic contact with the second shield shell.

A connection structure of connectors according to an aspect of the invention includes a first connector and a second connector. One of the first and second connectors includes one shield shell, and the other connector includes an other shield shell. The one shield shell is insertable into the other shield shell in the first direction. The one shield shell includes a lock portion and an engaging portion. The other shield shell includes a half-lock spring and an engagement hole. When the one shield shell is inserted into the other shield shell, the engaging portion is inserted into the engagement hole, and substantially simultaneously the half-lock spring is locked with the lock portion.

The connection structure of this aspect generates a click feel by the locking of the half-lock spring with the lock portion substantially at the same time as the insertion of the engaging portion into the engagement hole. This click feel allows workers to recognize that the connectors have been connected together.

The one shield shell or the other shield shell may further include a grounding contact spring. While the one shield shell is being inserted into the other shield shell, the half-lock spring may be in elastic contact with the one shield shell from when contacting the one shield shell until when locked with the lock portion. The grounding contact spring of the one or other shield shell may be configured to come into elastic contact with the other shield shell or the one shield shell before the half-lock spring makes contact with the one shield shell. A load applied to the other shield shell when the grounding contact spring makes elastic contact with the other shield shell, or alternatively a load applied to the one shield shell when the grounding contact spring makes elastic contact with the one shield shell, may be smaller than a load applied to the one shield shell when the half-lock spring makes elastic contact with the one shield shell.

The one connector may further include an insulator housed in the one shield shell. The other connector may further include an insulative body housed in the other shield shell and at least one terminal held by the body. In this case, the at least one terminal may be configured to make elastic contact with the insulator substantially at a same time as the half-lock spring makes elastic contact with the one shield shell.

Alternatively, the one connector may further include, in place of the insulator, an insulative body housed in the one shield shell and at least one terminal held by the body. In this case, the at least one terminal inside the one shield shell may be configured to make elastic contact with the at least one terminal inside the other shield shell substantially at a same time as the half-lock spring makes elastic contact with the one shield shell.

The one shield shell may include the half-lock spring in place of the lock portion, and the other shield shell may include the lock portion in place of the half-lock spring. In this variant, when the first shield shell is inserted into the second shield shell, the engaging portion is inserted into the engagement hole, and substantially simultaneously the half-lock spring is locked with the lock portion.

The one or other shield shell of the variant connection structure may further include a grounding contact spring. While the one shield shell is being inserted into the other shield shell, the half-lock spring may make elastic contact with the other shield shell from when contacting the other shield shell until when locked with the lock portion. The grounding contact spring of the one or other shield shell may make elastic contact with the other shield shell or the one shield shell before the half-lock spring makes contact with the other shield shell. A load applied to the other shield shell when the grounding contact spring makes elastic contact with the other shield shell, or alternatively a load applied to the one shield shell when the grounding contact spring makes elastic contact with the one shield shell, may be smaller than a load applied to the other shield shell when the half-lock spring makes elastic contact with the other shield shell.

In the above variant connection structure, where the one connector further includes the insulator and the other connector further includes a body and at least one terminal held by the body, the at least one terminal may be configured to make elastic contact with the insulator substantially at a same time as the half-lock spring makes elastic contact with the other shield shell.

Alternatively, in the above variant connection structure, where each of the one and other connectors further includes a body and at least one terminal, the at least one terminal inside the one shield shell may be configured to make elastic contact with the at least one terminal inside the other shield shell substantially at a same time as the half-lock spring makes elastic contact with the one shield shell.

A sound may be generated by at least one of the following means: insertion of the third position restrictor of the latch arm into the engagement hole, or locking of the half-lock spring with the lock portion.

The one connector may further include at least one electronic component mounted on the insulator and at least one optical fiber optically connected to the at least one electronic component.

It should be noted that the engaging portion may be the third position restrictor of the latch arm.

A method for manufacturing a connector of the invention includes: preparing an insulator having a first face and a second face opposite to the first face; preparing a shield shell including a shell body, a first position restrictor, and a second position restrictor, wherein the shell body includes an insertion port opening to one side in a first direction, the first position restrictor is provided at an edge portion of the insertion port of the shell body and located inside the insertion port, the second position restrictor is provided in the shell body so as to oppose the first position restrictor with a spacing therebetween in a second direction, and the second direction is substantially orthogonal to the first direction; and inserting the insulator into the shell body through the insertion port while bringing the first and second position restrictors into abutment with the first and second faces, respectively, of the insulator.

In the manufacturing method of this aspect, when the insulator is inserted into the insertion port of the shell body, the first position restrictor at the edge portion of the insertion port of the shell body and the second position restrictor opposing the first position restrictor make abutment with the first and second faces, respectively, of the insulator to restrict the position of the insulator. This arrangement facilitates the insertion of the insulator into the shell body.

Where the shield shell includes the latch arm described above, the inserting of the insulator into the shell body may include bringing the third position restrictor into abutment with the first face of the insulator inside the shell body. In the manufacturing method of this aspect, when the insulator is inserted into the insertion port, when the insulator is inserted into the insertion port, the position of the insulator is restricted by the abutment of the first and second position restrictors, and by the abutment of the third position restrictor of the latch arm inside the shell body. Thus, the insulator is less likely to be slanted when being inserted into the shell body.

Where the shield shell includes the fourth position restrictor described above, the inserting of the insulator into the shell body may include bringing the fourth position restrictor into abutment with the first face of the insulator inside the shell body. In the manufacturing method of this aspect, when the insulator is inserted into the insertion port, the position of the insulator is restricted by the abutment of the first and second position restrictors, and by the abutment of the fourth position restrictor inside the shell body. Thus, the insulator is less likely to be slanted when being inserted into the shell body.

The above method for manufacturing a connector may further include, after the inserting of the insulator into the shell body, pressing the fourth position restrictor into the shell body to fit the fourth position restrictor into a fitting recess in the insulator. In the manufacturing method of this aspect, when inserting the insulator into the shell body, the fourth position restrictor is used as a position restrictor and then pressed to fit into the fitting recess of the insulator. As a result, the insulator is fixed in position in the first direction inside the shell body.

Where the shield shell includes the fifth position restrictor described above, the inserting of the insulator into the shell body may include bringing the fifth position restrictor into abutment with the second face of the insulator inside the shell body. In the manufacturing method of this aspect, when the insulator is inserted into the insertion port, the position of the insulator is restricted by the abutment of the first and second position restrictors, and by the abutment of the fifth position restrictor inside the shell body. Thus, the insulator is less likely to be slanted when being inserted into the shell body.

BRIEF DESCRIPTION OF DRAWINGS

FIG. 10A is a cross-sectional view of the connection structure, taken along line 8A-8A in FIG. 7A, showing a state where at least one half-lock spring has contacted the distal portion of the shell of the one connector and substantially simultaneously a terminal of the other connector has elastically contacted a circuit board of the one connector while the one connector is being inserted into the other connector.

DESCRIPTION OF EMBODIMENTS

Embodiments of the invention will now be described.

First Embodiment

Figure 1A:
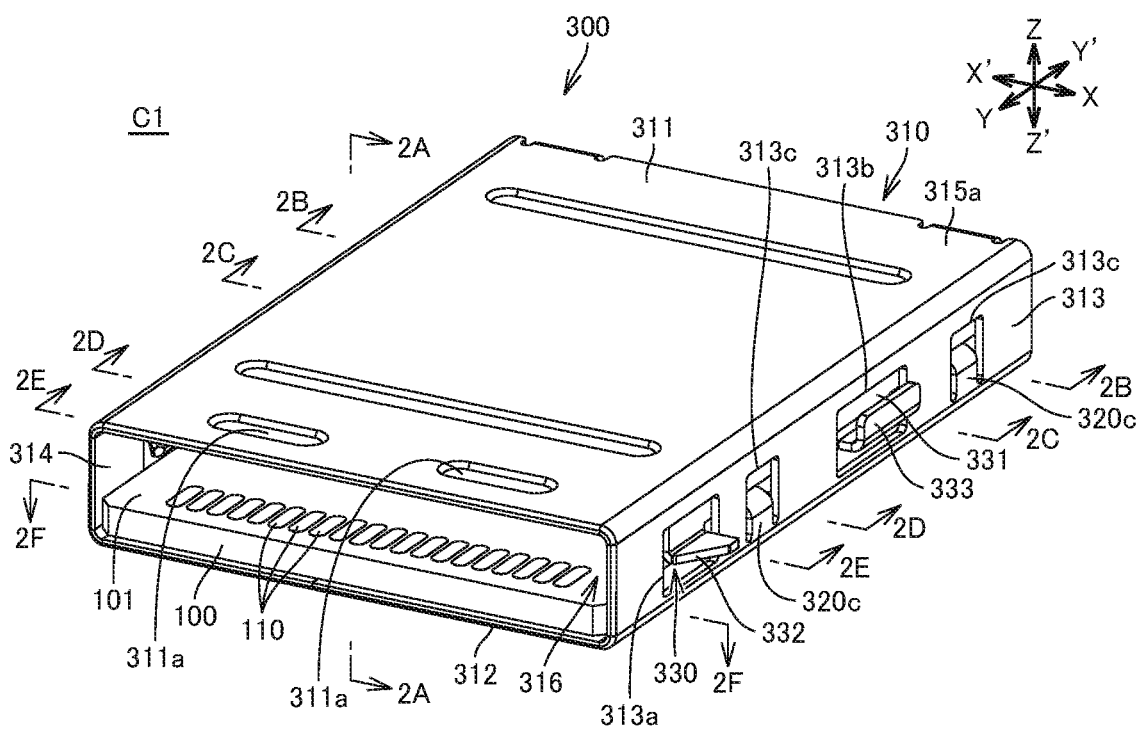
FIG. 1A is a front, top, right side perspective view of a connector according to a first embodiment of the invention.
Figure 1B:
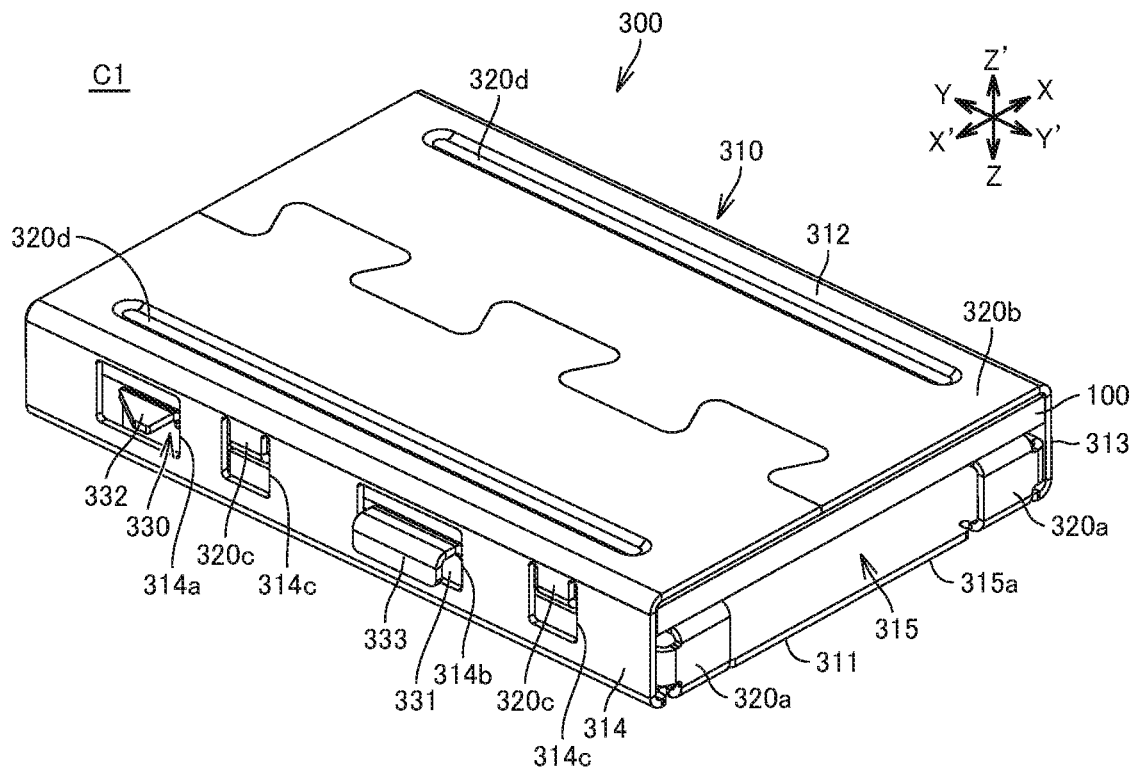
FIG. 1B is a rear, bottom, left side perspective view of the connector.
Figure 2A:
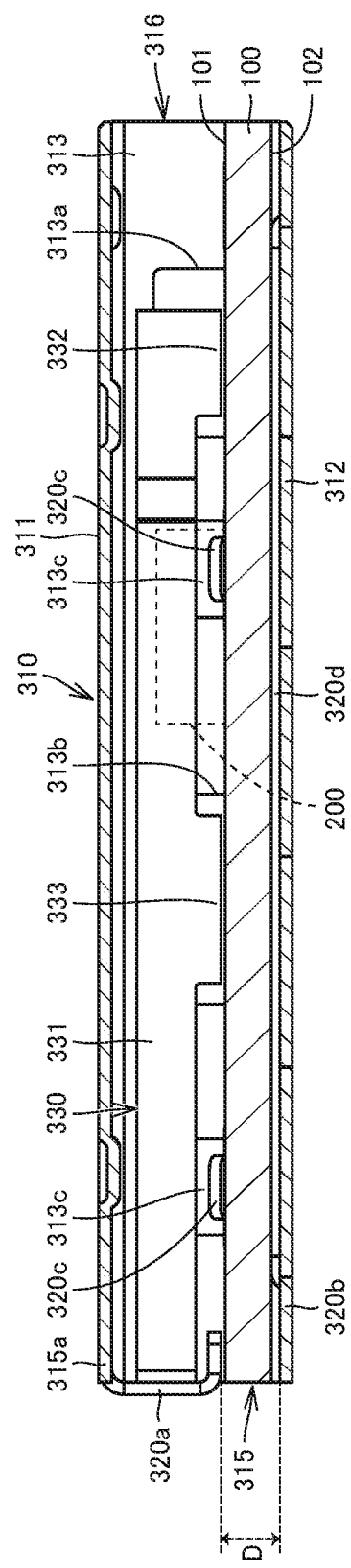
FIG. 2A is an enlarged cross-sectional view of the connector, taken along line 2A-2A in FIG. 1A.
Figure 2B:
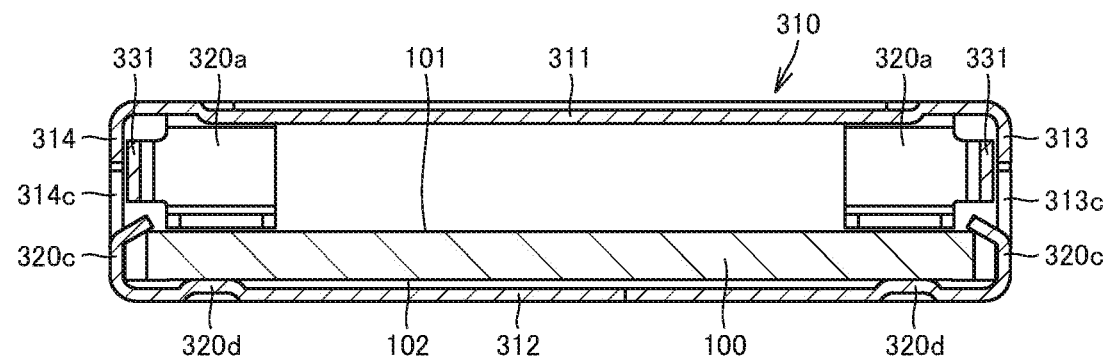
FIG. 2B is an enlarged cross-sectional view of the connector, taken along line 2B-2B in FIG. 1A.
Figure 2C:
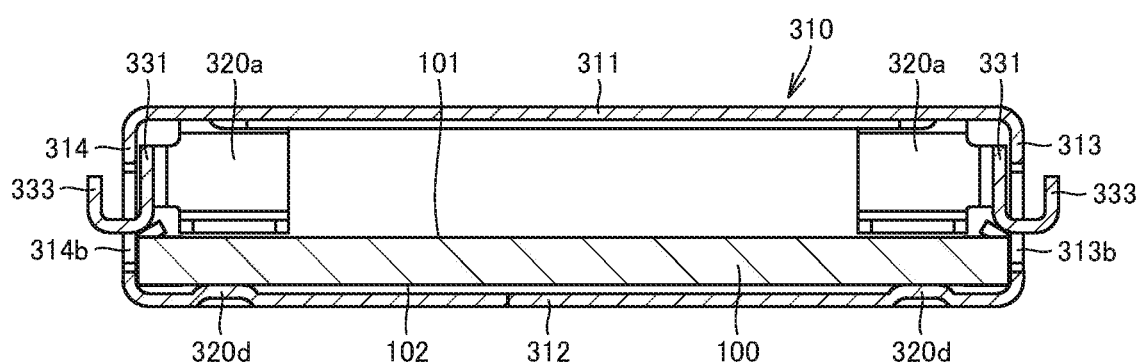
FIG. 2C is an enlarged cross-sectional view of the connector, taken along line 2C-2C in FIG. 1A.
Figure 2D:
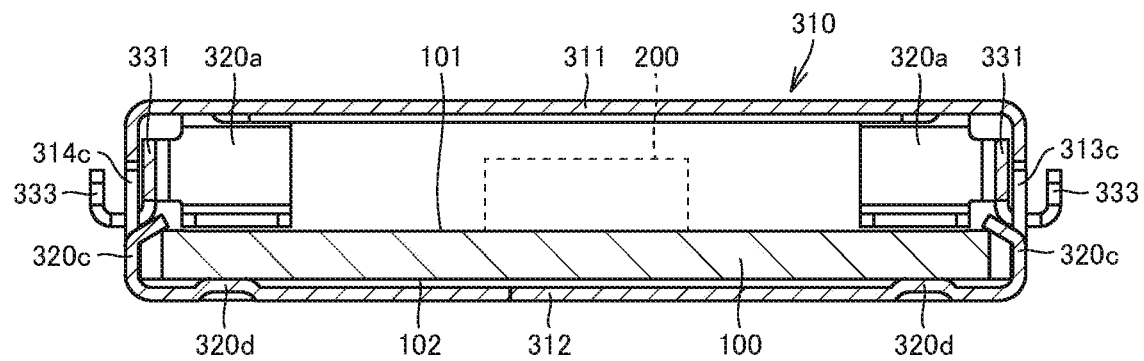
FIG. 2D is an enlarged cross-sectional view of the connector, taken along line 2D-2D of FIG. 1A.
Figure 2E:
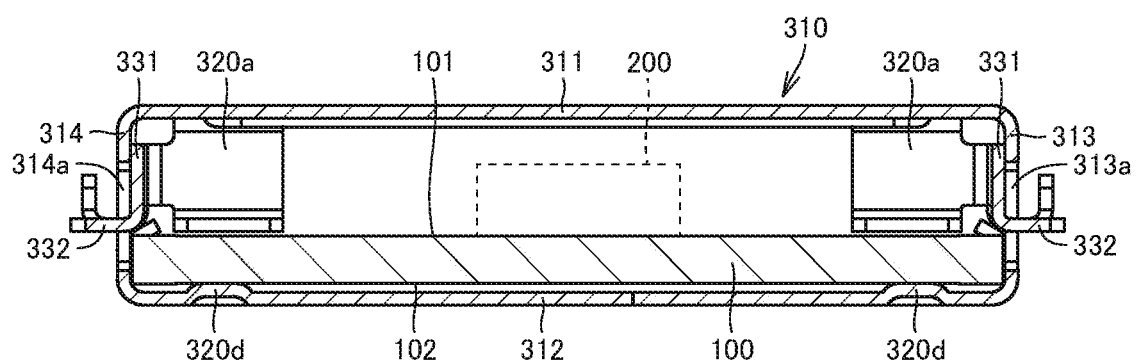
FIG. 2E is an enlarged cross-sectional view of the connector, taken along line 2E-2E in FIG. 1A.
Figure 2F:
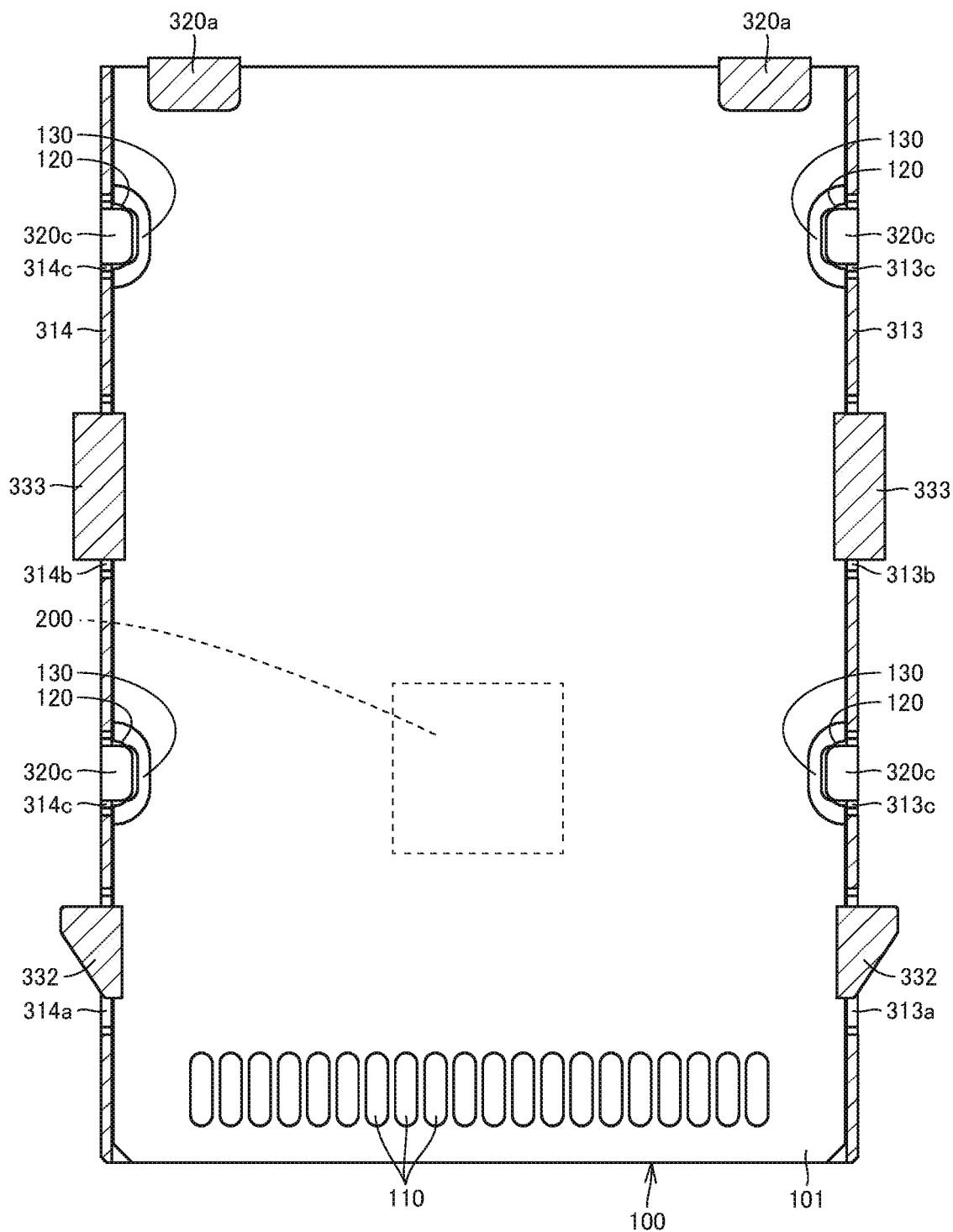
FIG. 2F is an enlarged cross-sectional view of the connector, taken along line 2F-2F in FIG. 1A.

The following is a description of a connector C1 according to a plurality of embodiments, including a first embodiment, of the invention with reference to FIGS. 1A to 4. FIGS. 1A to 4 illustrate the connector C1 according to the first embodiment. The Y-Y' direction indicated in FIGS. 1A and 1B corresponds to a first direction in the claims. In the Y-Y' direction, the Y' direction corresponds to one side in the first direction, and the Y direction corresponds to the other side in the first direction. The Z-Z' direction indicated in FIGS. 1A and 1B is substantially orthogonal to the Y-Y' direction and corresponds to a second direction in the claims. The X-X' direction indicated in FIGS. 1A and 1B is substantially orthogonal to the Y-Y' and Z-Z' directions, but the X-X' direction only needs to be substantially orthogonal to the Y-Y' direction and cross the Z-Z' direction.

The connector C1 includes a circuit board 100 (insulator), at least one electronic component 200, and a shield shell 300 (which may also be referred to simply as the shell 300). It should be noted that the at least one electronic component 200 is illustrated with broken line in FIGS. 2A and 2D to 4.

The circuit board 100 has a first face 101 and a second face 102. The first face 101 is a face of the circuit board 100 facing in the Z direction, and the second face 102 is a face of the circuit board 100 facing in the Z' direction (face opposite to the first face 101). An end Y-direction-side portion of the first face 101 of the circuit board 100 may be provided with a plurality of electrodes 110 arranged at spaced intervals in the X-X' direction. Each of end portions on the X- and X'-direction sides of the circuit board 100 may be provided with at least one fitting recess 120.

The at least one electronic component 200 may be any device mountable on the first face 101 of the circuit board 100. The at least one electronic component 200 may be an opto-electronic converter and/or an electro-optical converter, for example. In this case, the connector C1 may further include at least one optical fiber 400 (not illustrated) that is optically connected to the at least one electronic component 200 (see FIGS. 7 to 11B for illustration). The optical fiber 400 is led out of a shell body 310.

The opto-electronic converter is a light receiving element, such as a photodiode. The opto-electronic converter is configured to convert optical signals, which have been incident from the optical fiber 400, into electric signals and output the converted electric signals to a conductive line or bonding wire (not illustrated) of the circuit board 100.

The electro-optical converter is a light emitting element, such as a semiconductor laser or a light emitting diode. The electro-optical converter is configured to convert electric signals, which have been inputted through a conductive line or bonding wire of the circuit board 100, into optical signals and emit the converted optical signals to the optical fiber 400.

The at least one electronic component 200 may be a plurality of electronic components. Where one of the electronic components 200 is an opto-electronic or electro-optical converter, the remaining electronic components 200 may include an opto-electronic, or electro-optical, conversion circuit mounted on the first face 101 of the circuit board 100.

The opto-electronic conversion circuit is connected to the opto-electronic converter via a conductive line or bonding wire of the circuit board 100. The opto-electronic conversion circuit is configured to process electric signals that have been converted from optical signals by the opto-electronic converter.

The electro-optical conversion circuit is connected to the electro-optical converter via a conductive line or bonding wire of the circuit board 100. The electro-optical conversion circuit is configured to convert electric signals, which have been inputted to the electro-optical conversion circuit, into predetermined kind of signals that can be converted into optical signals and to output the converted signals to the electro-optical converter to allow the electro-optical converter to emit the optical signals.

Obviously, the plurality of electronic components 200 may include at least one opto-electronic converter, at least one electro-optical converter, at least one opto-electronic conversion circuit, and at least one electro-optical conversion circuit. The number of optical fibers 400 may preferably correspond to the number of the opto-electronic and/or electro-optical converters.

The shell 300 is formed of a single metal plate. The shell 300 includes the shell body 310 having a generally tubular shape extending in the Y-Y' direction. The substantially tubular shape in the invention may be a polygonal section tube, a circular section tube, a polygonal section tube with a cutout extending from an end in the Y direction to an end of Y' (having a substantially angular C-shaped section in the Z-Z' direction), or a substantially circular section tube with a cutout extending from an end in the Y direction to an end of Y' (having a substantially C-shaped section in the Z-Z' direction). The shell body 310 houses the circuit board 100 with the at least one electronic component 200 mounted thereon. In the Z-Z' direction, a Z-direction-side portion of the shell body 310 (a first plate 311 in FIGS. 1A to 4) may preferably be disposed at such a height position as not to make contact with the very end in the Z-direction of the at least one electronic component 200.

The shell body 310 includes the insertion port 315, an edge portion 315a thereof, and a connection port 316 opposite to the insertion port 315. The insertion port 315 opens in the Y' direction, and the connection port 316 opens in the Y direction. The insertion port 315 is configured to allow therethrough insertion of the circuit board 100 and the electronic component 200 into the shell body 310. The edge portion 315a of the insertion port 315 includes a Z-direction-side portion and a Z'-direction-side portion, an X-direction-side portion, and an X'-direction-side portion. The connection port 316 is configured to allow insertion and removal therethrough of part of a body and parts of terminals of a mating connector (not illustrated). The part of the terminal is contactable with the electrodes 110 of the circuit board 100.

In FIGS. 1A to 4, the shell body 310 is a square section tube and has the first plate 311 on the Z-direction side, a second plate 312 on the Z'-direction side, a third plate 313 on the X-direction side, and a fourth plate 314 on the X'-direction side. In this case, the edge portion 315a of the insertion port 315 of the shell body 310 includes the Y'-direction-side end portion of each of the first, second, third, and fourth plates 311, 312, 313, and 314. In other words, a Z-direction-side portion of the edge portion 315a is the end portion on Y' direction side of the first plate 311, a Z'-direction side portion of the edge portion 315a is the Y'-direction-side end portion of the second plate 312, an X-direction-side portion of the edge portion 315a is the Y'-direction-side end portion of the third plate 313, and an X'-direction-side portion of the edge portion 315a is the Y'-direction-side end portion of the fourth plate 314. The first plate 311 may be provided with a lock portion or portions 311a. The or each lock portion 311a may be a blind hole, a through-hole extending through the first plate 311, or a protrusion. The lock portion or portions 311a may be omitted.

The shell 300 further includes a pair of first position restrictors 320a. The first position restrictors 320a only needs to be provided at the edge portion 315a of the insertion port 315 of the shell body 310 and located inside the insertion port 315 and on the Z-direction side with respect to the circuit board 100. For example, the first position restrictors 320a may be each be piece members, each of which has a generally L- or U-shaped cross section in the Z-Z' direction and includes a first portion and a second portion. Specifically, the first position restrictors 320a may have a configuration 1) or 2) below.

1) As illustrated in FIGS. 1A to 4, the first portions of the first position restrictors 320a extend rectilinearly or arcuately from an end in the Y' direction of the Z-direction-side portion of the edge portion 315a of the shell body 310, to the inside of the insertion port 315 (in the Z' direction). The second portions of the first position restrictors 320a extend rectilinearly or arcuately in the Y direction from the respective ends in the Z' direction of the first portions.

2) In one of the first position restrictors 320a, the first portion extends rectilinearly or arcuately from the end in the Y' direction of the X-direction-side portion of the edge portion 315a of the shell body 310, to the inside of the insertion port 315 (in the X' direction), and the second portion extends rectilinearly or arcuately in the Y direction from the end in the Z' direction of the first portion (not illustrated). In the other first position restrictor 320a, the first portion extends rectilinearly or arcuately from the end in the Y' direction of the X'-direction-side portion of the edge portion 315a of the shell body 310, to the inside of the insertion port 315 (in the X direction), and the second portion extends rectilinearly or arcuately in the Y direction from the end in the Z' direction of the first portion (not illustrated).

In each first position restrictor 320a of any of the above aspects, the corner where the first and second portions meet may preferably, but is not required to, form a chamfered face.

In another aspect, each first position restrictor 320a may be a piece member having only the first portion of any of the above aspects. In yet another aspect, each first position restrictor 320a may be a piece member formed by partly cutting out a Z-direction-side portion of the edge portion 315a of the insertion port 315 of the shell body 310 and bending the cut-out part to the inside of the insertion port 315 (to the Z'-direction side).

In any of the above aspects, each first position restrictor 320a is arranged at a position not to interfere with the electronic component 200 when the circuit board 100 and the electronic component 200 are inserted into the shell body 310 through the insertion port 315. In FIGS. 1A to 4, the pair of first position restrictors 320a are respectively arranged inside the shell body 310, at the end portions on the X- and X'-direction sides of the shell body 310, so as to avoid interference with the electronic component 200 mounted on a central portion of the first face 101 of the circuit board 100.

The shell 300 further includes at least one second position restrictor 320b. The at least one second position restrictor 320b is provided in the shell body 310 so as to oppose the first position restrictor 320a with a spacing therebetween in the Z-Z' direction, and is located on the Z'-direction side with respect to the circuit board 100. For example, the at least one second position restrictor 320b may be a Z'-direction-side portion of the edge portion 315a of the insertion port 315 of the shell body 310 (in FIGS. 1A to 4, an Y'-direction-side end portion of the second plate 312) that opposes the first position restrictors 320a with a spacing therebetween in the Z-Z' direction.

Each distance D in the Z-Z' direction from the first position restrictors 320a to the at least one second position restrictor 320b of any of the above aspects is substantially equal to, or slightly larger than, a distance in the Z-Z' direction from the first face 101 to the second face 102 of the circuit board 100 (i.e., a thickness dimension of the circuit board 100 in the Z-Z' direction). Accordingly, it is configured such that when the circuit board 100 is inserted into the shell body 310 through the insertion port 315, the first position restrictor 320a and the at least one second position restrictor 320b can abut the first face 101 of the circuit board 100 and the second face 102 of the circuit board 100, respectively, inside the insertion port 315. It should be noted that the invention only requires at least one first position restrictor.

The shell 300 may further include a pair of latch arms 330. Each of the latch arms 330 includes an arm 331 and an engaging portion 332 (third position restrictor). The arms 331 extend in the Y direction inside the shell body 310 from the respective first position restrictors 320a of any of the above aspects, are located on the Z-direction side with respect to the circuit board 100 housed in the shell body 310, and are elastically deformable in the X-X' direction. In FIGS. 1A to 4, the arms 331 of the latch arms 330 extend in the Y direction inside the shell body 310, respectively from the ends in the X- and X'-directions of the first portions of the first position restrictors 320a. In another aspect, the arms 331 may extend in the Y direction inside the shell body 310, not from the respective first position restrictor 320a but from the edge portion 315a of the insertion port 315 of the shell body 310, be located on the Z-direction side with respect to the circuit board 100 housed in the shell body 310, and be elastically deformable in the X-X' direction.

The engaging portions 332 of the latch arms 330 may be claws extending in the X and X' direction, respectively, from respective free ends of the arms 331. Proximal portions of the engaging portions 332 are located inside the shell body 310, on the Z-direction side with respect to the circuit board 100. The proximal portions of the engaging portions 332 may be located in the Z-Z' direction with a small clearance from the first face 101 of the circuit board 100 (see FIGS. 2A and 2E), or alternatively may abut the first face 101 of the circuit board 100. In the Z-Z' direction, the ends in the Z' direction of the proximal portions of the engaging portions 332 may preferably be at the same height position as, and may be at a slightly different height position from, the height position of the ends in the Z' direction of the first position restrictors 320a. The engaging portions 332 thus configured can come into abutment with the first face 101 of the circuit board 100 inside the shell body 310 when the circuit board 100 is inserted into the shell body 310 through the insertion port 315. Portions on the X- and X'-direction sides of the shell body 310 (the third plate 313 and the fourth plate 314 in FIGS. 1A to 4) are provided with respective first openings 313a and 314a at positions corresponding to the respective engaging portions 332. Distal portions of the engaging portion 332 protrude through the corresponding first openings 313a and 314a to the outside of the shell body 310. Where the part of the body and the parts of the terminals of the mating connector are inserted into the shell body 310 through the connection port 316 as described above and a part on the Y-direction side of the shell body 310 fits into the shell of the mating connector, the distal portions of the engaging portions 332 are respectively inserted into engagement holes of a shell of the mating connector and caught against edges of these engagement holes.

The latch arms 330 may further include respective operating portions 333 (third position restrictors). The operating portions 333 respectively extend in the X and X' directions, from respective intermediate portions between the free ends of the arms 331 and the first position restrictors 320a, and include proximal portions located inside the shell body 310, on the Z-direction side with respect to the circuit board 100. The proximal portions of the operating portions 333 may be located in the Z-Z' direction with a small clearance from the first face 101 of the circuit board 100 (see FIGS. 2A and 2C), or alternatively may abut the first face 101 of the circuit board 100. In the Z-Z' direction, the ends in the Z' direction of the proximal portions of the operating portion 333 may preferably be at the same height position as, and may be at a slightly different height position from, the height position of the ends in the Z' direction of the first position restrictors 320a. The proximal portions of the operating portions 333 thus configured can come into abutment with the first face 101 of the circuit board 100 inside the shell body 310 when the circuit board 100 is inserted into the shell body 310 through the insertion port 315. Portions on the X- and X'-direction sides of the shell body 310 (the third plate 313 and the fourth plate 314 in FIGS. 1A to 4) are provided with respective second openings 313b and 314b at positions corresponding to the respective operating portions 333. Distal portions of the operating portion 333 protrude through the corresponding second openings 313b and 314b to the outside of the shell body 310.

Where the operating portions 333 are respectively pressed in the X' and X directions, the arms 331 is caused to deform elastically in the X' and X directions, respectively, and the engaging portions 332 are displaced the X' and X directions, respectively, and the distal portions of the engaging portions 332 are housed inside the shell body 310 through the first openings 313a and 314a. This allows the distal portions of the engaging portions 332 to be released from the state in which that the distal portions are caught in the engagement holes of the shell of the mating connector.

It should be appreciated that each latch arm of the invention only needs to include at least one third position restrictor. The at least one third position restrictor may be provided on the arm of a latch arm separately from the engaging portion and the operating portion of the latch arm. The thus modified third position restrictor or restrictors only need to be provided on an arm or arms 331, located inside the shell body 310, on the Z-direction side with respect to the circuit board 100, and abuttable on the first face 101 of the circuit board 100 inside the shell body 310 when the circuit board 100 is inserted into the shell body 310 through the insertion port 315. The modified third position restrictor or restrictors may coexist with the engaging portion and/or the operating portion of each latch arm. Also, the invention may include at least one latch arm or no latch arms.

The shell 300 may further include at least one pair of fourth position restrictors 320c provided in the shell body 310. The fourth position restrictors 320c are located inside the shell body 310 and on the Y-direction side with respect to the first position restrictors 320a.

The pair of fourth position restrictors 320c are piece members formed by cutting out the X- and X'-direction-side portions of the shell body 310 (in FIGS. 1A to 4, a portion of the third plate 313 and a portion of the fourth plate 314) and bending the cut-out parts in the X'- and X-directions, respectively. The fourth position restrictors 320c include respective proximal portions extending in the Z-Z' direction and respective distal portions extending from the proximal portions to the inside of the shell body 310 (in the X' and X directions). The distal portions of the fourth position restrictors 320c fit into the corresponding fitting recesses 120 of the circuit board 100 (see FIGS. 2B, 2D, and 2F). The fourth position restrictors 320c thus function as fixing portions that fix the circuit board 100 in position and restrict the movement of the circuit board 100 in the Y-Y' direction inside the shell body 310. In the state before fitting into the fitting recesses 120 (this state may also be referred to simply as the pre-fitting state), the distal portions of the fourth position restrictors 320c are located inside the shell body 310, on the Z-direction side with respect to the circuit board 100 (see FIG. 4). In such a pre-fitting state, the distal portions of the fourth position restrictors 320c may be located in the Z-Z' direction with a small clearance from the first face 101 of the circuit board 100, or alternatively may abut the first face 101 of the circuit board 100. Also, in the pre-fitting state, the ends in the Z' direction of the distal portions of the fourth position restrictors 320c may preferably be at the same height position as, and may be at a slightly different height position from, the height position of the ends in the Z' direction of the or each pair of first position restrictors 320a. The fourth position restrictors 320c thus configured can come into abutment with the first face 101 of the circuit board 100 inside the shell body 310 when the circuit board 100 is inserted into the shell body 310 through the insertion port 315. The fourth position restrictors 320c thus function as position restrictors. After the circuit board 100 is inserted into the shell body 310, the distal portions of the fourth position restrictors 320c are bent further so as to be fitted into the fitting recesses 120 as described above, so that the fourth position restrictors 320c function as the fixing portions as described above. As a result of cutting out the X- and X'-direction-side portions of the shell body 310, third openings 313c and 314c are formed respectively around the fourth position restrictors 320c, i.e. the fourth position restrictors 320c are located inside the third openings 313c and 314c, respectively.

In FIGS. 1A to 4, each of the third plate 313 and the fourth plate 314 of the shell body 310 is provided with two fourth position restrictors and two third openings. In each of the third plate 313 and the fourth plate 314, one of the fourth position restrictors and one of the third openings are provided between the engaging portion 332 and the operating portion 333, and the remaining one of the fourth position restrictors and the remaining one of the third openings are provided on the Y'-direction side with respect to the operating portion 333. Each of the third plate 313 and the fourth plate 314 of the shell body 310 may be provided with three or more fourth position restrictors and three or more third openings.

In another aspect, the at least one pair of fourth position restrictors 320c may not function as the position restrictor described above but function only as the fixing portions. In this case, the or each pair of fourth position restrictors 320c only need to be configured to be formed by respectively cutting out X- and X'-direction-side portions of the shell body 310 and bending these portions so as to fit in the respective fitting recesses 120. As a result of cutting out the portions, the third openings 313c and 314c are formed also around such fourth position restrictors 320c.

The fitting recesses 120 of the circuit board 100 may respectively be provided with electrodes 130 by plating or other means. In this case, it is preferable that the at least one pair of fourth position restrictors 320c fit in, and be electrically connected to, the respective fitting recesses 120. This establishes electrical connection between the shell body 310 and the circuit board 100 and allows the circuit board 100 to be grounded via the shell body 310.

In yet another aspect, the at least one pair of fourth position restrictors 320c may not function as the fixing portions but function only as the position restrictor described above. This configuration can be provided by not to bend the distal portions of the at least one pair of fourth position restrictors 320c after the circuit board 100 is inserted into the shell body 310. The shell body 310 may be provided with fixing portions separately from the fourth position restrictor 320c. It should be noted that the invention may include at least one fourth position restrictor or no fourth position restrictors. It is also possible to omit the fitting recesses 120 of the circuit board 100, or alternatively the fitting recesses 120 and the electrodes 130 of the circuit board 100.

The shell 300 may further include at least one fifth position restrictor 320d. The at least one fifth position restrictor 320d is provided in a portion on Z'-direction side of the shell body 310 (the second plate 312 in FIGS. 1A to 4), located on the Y-direction side with respect to the at least one second position restrictor 320b, and located inside the shell body 310, on the Z'-direction side with respect to the circuit board 100. Specifically, the or each fifth position restrictors 320d may be a protrusion protruding in the Z direction provided in a Z'-direction-side portion of the shell body 310 (see FIGS. 2B to 2E), or alternatively a piece member formed by cutting out the Z'-direction-side portion, and may be located inside the shell body 310 so as to abut the second face 102 of the circuit board 100 from the Z'-direction side, or alternatively may be located inside the shell body 310 with a small clearance from the second face 102. In the Z-Z' direction, the end or respective ends in the Z direction of the at least one fifth position restrictors 320d may be located at a height position on the Z-direction side with respect to, or alternatively at the same height position as, the height position of the end or respective ends in the Z direction of the at least one second position restrictor 320b (see FIGS. 2A to 2E). The at least one fifth position restrictor 320d thus configured can come into abutment with the second face 102 of the circuit board 100 inside the shell body 310 when the circuit board 100 is inserted into the shell body 310 through the insertion port 315. In FIGS. 1A to 4, the at least one fifth position restrictor 320d is illustrated as a plurality of protrusions extending in the Y-Y' direction.

In another aspect, the at least one fifth position restrictor 320d may be at least part of a Z'-direction-side portion (the second plate 312 in FIGS. 1A to 4) of the shell body 310. The at least one fifth position restrictor may be omitted in the invention.

Figure 3:
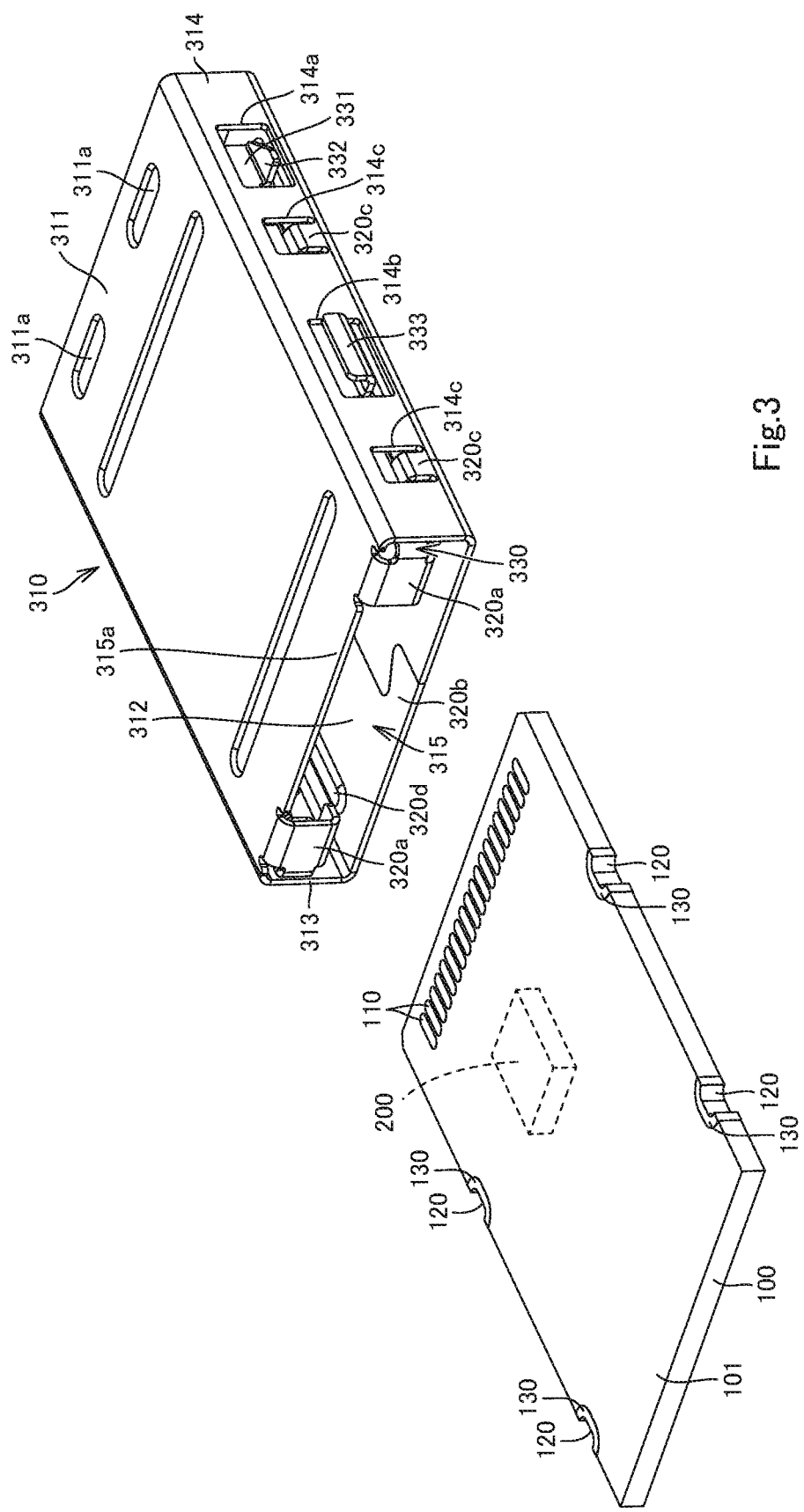
FIG. 3 is an exploded, rear, top, left side perspective view of the connector.
Figure 4:
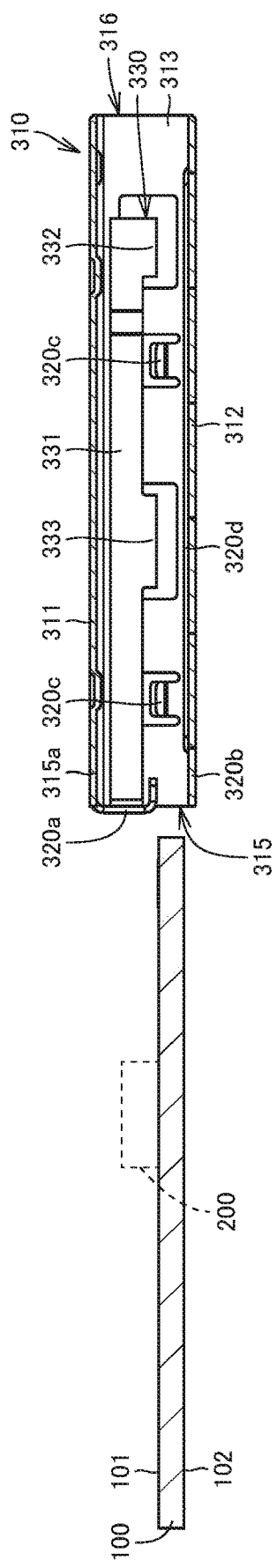
FIG. 4 is an exploded, cross-sectional view of the connector corresponding to FIG. 2A.

Methods for manufacturing the connector C1 described above will now be described with reference to FIGS. 3 and 4. First prepared is the circuit board 100, on the first face 101 of which the at least one electronic component 200 is mounted. Where the at least one electronic component 200 is an opto-electronic converter and/or an electro-optical converter, the at least one electronic component 200 may be connected to the at least one optical fiber 400.

The shell 300 is prepared. The shell 300 includes the shell body 310 of any of the above aspects, the pair of first position restrictors 320a, and the at least one second position restrictor 320b. In this case, the circuit board 100 is placed and inserted between the pair of first position restrictors 320a and the at least one second position restrictor 320b (i.e. in the insertion port 315 of the shell body 310). This allows insertion of the circuit board 100 into the shell body 310 through the insertion port 315 of the shell body 310 (this step may also be referred to as "during the insertion of the circuit board 100") while bringing the pair of first position restrictors 320a into abutment with the first face 101 of the circuit board 100 and bringing the at least one second position restrictor 320b into abutment with the second face 102 of the circuit board 100. This prevents the at least one electronic component 200 mounted on the first face 101 of the circuit board 100 from colliding with the edge portion 315a of the insertion port 315 of the shell body 310 during the insertion of the circuit board 100.

Where each of the first position restrictors 320a has the generally L- or U-shaped cross section and the chamfered corner as described above, the circuit board 100 is brought into abutment with the chamfered faces and thereby guided to between the first position restrictors 320a and the at least one second position restrictor 320b.

Where the shell 300 includes the pair of latch arms 330 of any of the above aspects, the third position restrictors of the latch arms 330 (such as the proximal portions of the engaging portions 332 and/or the proximal portions of the operating portions 333) can be brought into abutment with the first face 101 of the circuit board 100 inside the shell body 310 during the insertion of the circuit board 100. In this case, the circuit board 100 is less likely to tilt in the Z direction.

Where the shell 300 includes the at least one pair of fourth position restrictors 320c functioning both as the position restrictors and the fixing portions described above, the distal portions of the fourth position restrictors 320c can be brought into abutment with the first face 101 of the circuit board 100 inside the shell body 310 during the insertion of the circuit board 100. Also in this case, the circuit board 100 is less likely to tilt in the Z direction inside the shell body 310. Where the circuit board 100 is provided with the at least one pair of fitting recesses 120, the insertion of the circuit board 100 into the shell body 310 will cause the distal portions of the at least one pair of fourth position restrictors 320c to be aligned with the at least one pair of fitting recesses 120 of the circuit board 100. After this insertion, jigs are inserted through the at least one pair of third openings 313c and 314c to press the distal portions of the fourth position restrictors 320c to the inside of the shell body 310. As a result, the distal portions of the fourth position restrictors 320c respectively fit into the fitting recesses 120. As a result, the circuit board 100 is fixed in position in the Y-Y' direction inside the shell body 310.

Where the at least one pair of fourth position restrictors 320c function only as the fixing portions, it is preferable that the at least one pair of fourth position restrictors 320c not be brought into abutment with the first face 101 of the circuit board 100 during the insertion of the circuit board 100, and after the insertion of the circuit board 100, jigs be inserted through the at least one pair of third openings 313c and 314c to press the at least one pair of fourth position restrictors 320c to the inside of the shell body 310 and fit the fourth position restrictors 320c respectively into the fitting recesses 120.

Where the fitting recesses 120 of the circuit board 100 are provided with the respective electrodes 130, the at least one pair of fourth position restrictors 320c may preferably be brought into contact respective with the at least one pair of electrodes 130 when fitting the fourth position restrictors 320c into the fitting recesses 120. This establishes electrical connection between the shell 300 and the circuit board 100.

Where the at least one pair of fourth position restrictors 320c function only as the position restrictors described above, after the insertion of the circuit board 100 into the shell body 310 as described above, the distal portions of the at least one pair of fourth position restrictors 320c are in abutment with the first face 101 of the circuit board 100

Where the shell 300 includes the at least one fifth position restrictor 320d of any of the above aspects, the at least one fifth position restrictor 320d can be brought into abutment with the second face 102 of the circuit board 100 inside the shell body 310 during the insertion of the circuit board 100. In this case, the circuit board 100 is less likely to tilt in the Z direction inside the shell body 310.

Where the shell 300 includes the at least one third position restrictor and/or the at least one fourth position restrictor 320c, and further includes the fifth position restrictor 320d, the at least one third position restrictor and/or the at least one fourth position restrictor 320c can be brought into abutment with the second face 102 of the circuit board 100, and the at least one fifth position restrictor 320d also with the second face 102 of the circuit board 100, inside the shell body 310 during the insertion of the circuit board 100. In this case, the circuit board 100 is less likely to tilt in the Z and Z' directions inside the shell body 310.

The connector C1 and the manufacturing methods thereof described above provide the following technical features and effects.

Technical Feature and Effect 1: It is easy to insert the circuit board 100 into the shell body 310 for the following reasons. The pair of first position restrictors 320a is provided at the edge portion 315a of the insertion port 315 of the shell body 310 and located inside the insertion port 315; the at least one second position restrictor 320b is provided in the shell body 310 so as to oppose the pair of first position restrictors 320a with a spacing therebetween; and each distance in the Z-Z' direction from the pair of first position restrictors 320a to the at least one second position restrictor 320b is substantially equal to, or slightly larger than, the thickness dimension in the Z-Z' direction of the circuit board 100. As such, when the circuit board 100 is inserted into the shell body 310 through the insertion port 315, the position of the circuit board 100 is restricted by abutment of the first and second position restrictors 320a and 320b respectively with the first and second faces 101 and 102 of the circuit board 100, facilitating the insertion of the circuit board 100 into the shell body 310. In addition, where tilting of the circuit board 100 during the insertion is suppressed as described above, it is easier to insert the circuit board 100 into the shell body 310.

Technical Feature and Effect 2: It is possible to suppress a decrease in strength of the shell body 310 of the shell 300 for the following reasons. Where the pair of first position restrictors 320a are piece members of any of the above aspects that extend from the end in the Y' direction of the edge portion 315a of the insertion port 315 of the shell body 310 to the inside of the insertion port 315, it is unnecessary to cut out portions of the edge portion 315a of the insertion port 315 in order to form the pair of first position restrictors 320a. This suppresses decrease in strength of the shell body 310. In addition, where the at least one third position restrictor of each of the pair of latch arms 330 is brought into abutment with the first face 101 of the circuit board 100 during the insertion of the circuit board 100, it is unnecessary to cut out portions of the shell body 310 in order to form the third position restrictors. This suppresses decrease in strength of the shell body 310. Also where the at least one fifth position restrictor 320d is at least one protrusion provided in a Z'-direction-side portion of the shell body 310 to protrude in the Z direction, it is unnecessary to cut out a portion of the shell body 310 in order to make the at least one fifth position restrictor 320d. This suppresses decrease in strength of the shell body 310.

Technical Feature and Effect 3: Where the at least one pair of fourth position restrictors 320c function as the position restrictors and the fixing portions, it is possible not only to restrict the position of the circuit board 100 with the at least one pair of fourth position restrictors 320c during the insertion of the circuit board 100, but also to fix the circuit board 100 in position in the Y-Y' direction by fitting the at least one pair of fourth position restrictors 320c into the fitting recesses 120 of the circuit board 100 after the insertion of the circuit board 100. In addition, where the fourth position restrictors 320c are connected to the electrode 130 of the fitting recesses 120 of the circuit board 100, it is possible not only to fix the circuit board 100 in position inside the shell body 310 and also to electrically connect the shield shell 300 to the circuit board 100.

Technical Feature and Effect 4: It is possible to reduce the number of steps for manufacturing the shell 300 for the following reasons. Where the at least one third position restrictor of each of the pair of latch arms 330 is brought into abutment with the first face 101 of the circuit board 100 during the insertion of the circuit board 100, it is possible to reduce the number of steps for manufacturing the shell 300 as compared with a case of fabricating the third position restrictors separately from the latch arms. Where the at least one pair of fourth position restrictors 320c function as the position restrictors and the fixing portions, it is possible to reduce the number of steps for manufacturing the shell 300 as compared with a case of fabricating the position restrictors and the fixing portions individually.

Second Embodiment

Figure 5A:
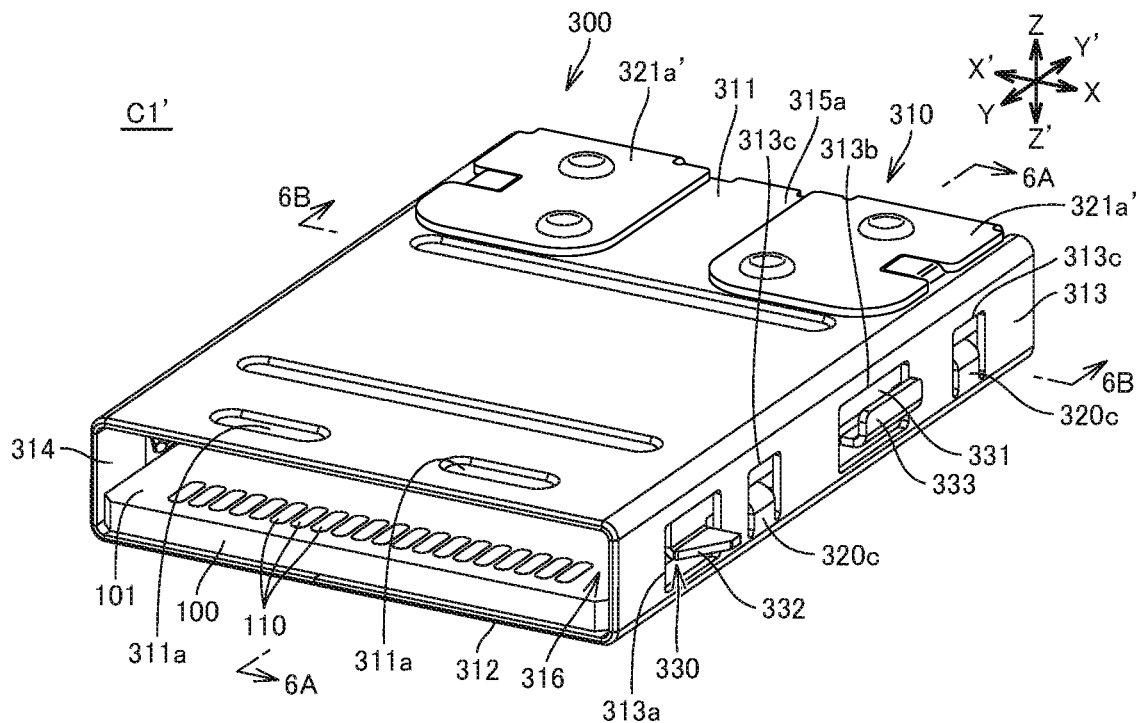
FIG. 5A is a front, top, right side perspective view of a connector according to a second embodiment of the invention.
Figure 5B:
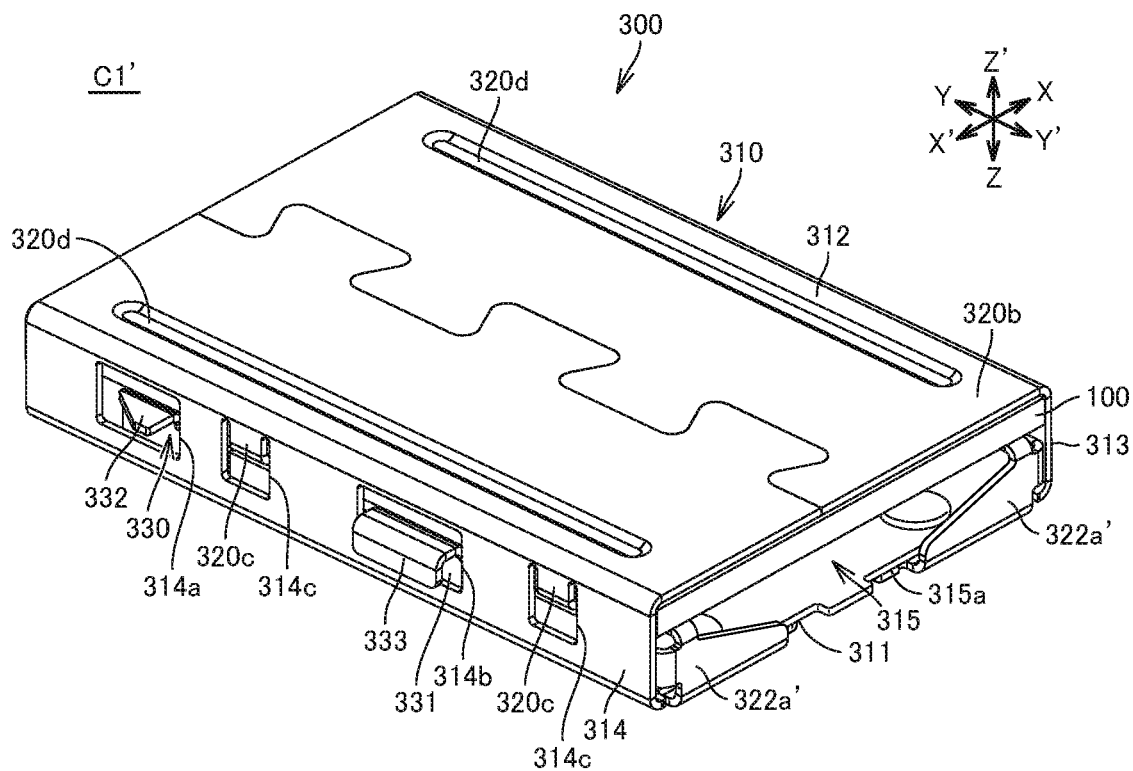
FIG. 5B is a rear, bottom, left side perspective view of the connector.
Figure 6A:
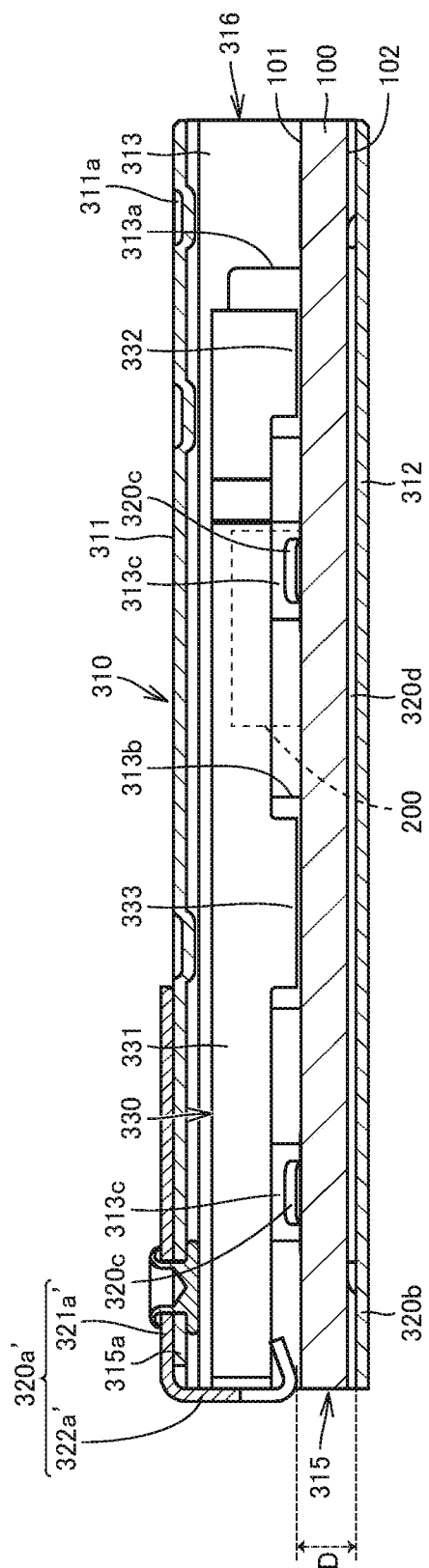
FIG. 6A is an enlarged cross-sectional view of the connector, taken along line 6A-6A in FIG. 5A.
Figure 6B:
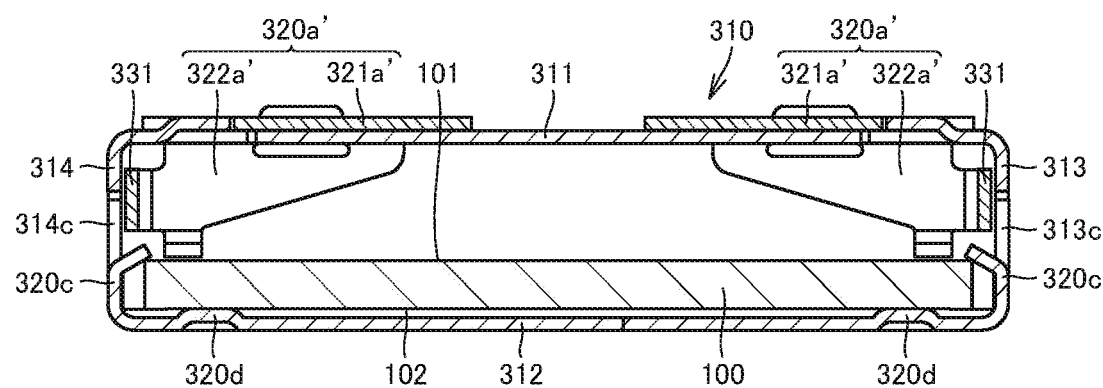
FIG. 6B is an enlarged cross-sectional view of the connector, taken along line 6B-6B in FIG. 5A.

The following is a description of a connector C1' according to a plurality of embodiments, including a second embodiment, of the invention with reference to FIGS. 5A to 6B. FIGS. 5A to 6B illustrate the connector C1' according to the second embodiment. As in FIGS. 1A and 1B, Y-Y', Z-Z', and X-X' directions are indicated in FIGS. 5A and 5B. The X-X' direction indicated in FIGS. 5A and 5B is also substantially orthogonal to the Y-Y' and Z-Z' directions, but the X-X' direction only needs to be substantially orthogonal to the Y-Y' direction and cross the Z-Z' direction.

The connector C1' may be configured similarly to the connector C1 of any of the above aspects, except that a pair of first position restrictors 320a' of the connector C1' is configured differently from the pair of first position restrictors 320a of the connector C1. The connector C1' will now be described focusing on the differences from the connector C1 and omitting overlapping descriptions.

The pair of first position restrictors 320a' is provided at an edge portion 315a of an insertion port 315 of a shell body 310 and located inside the insertion port 315 and on the Z-direction side with respect to a circuit board 100. More specifically, each of the first position restrictors 320a' is a separate member from the shell body 310 and includes an attaching portion 321a' and a restrictor body 322a'.

The attaching portions 321a' of the first position restrictors 320a' are attached to the edge portion 315a of the insertion port 315 of the shell body 310 by a known fixing means, such as a rivet, a screw, and an adhesive. The restricting bodies 322a' of the first position restrictors 320a' may be piece members, each of which has a generally L- or U-shaped cross section in the Z-Z' direction and includes a first portion and a second portion. Specifically, the first position restrictor 320a' may have a configuration 1) or 2) below.

1) The attaching portions 321a' of the first position restrictors 320a' are respectively attached to ends on the X- and X'-direction sides of a Z-direction-side portion of the edge portion 315a of the shell body 310 (see FIGS. 5A to 6B). In this case, the first portions of the restricting bodies 322a' of the first position restrictors 320a' extend rectilinearly or arcuately from the attaching portions 321a' to the inside of the insertion port 315 (in the Z' direction). The second portions of the restricting bodies 322a' extend rectilinearly or arcuately in the Y direction from the respective ends in the Z' direction of the first portions.

2) The attaching portions 321a' of the first position restrictors 320a' are attached respectively to X- and X'-direction-side portions of the edge portion 315a of the shell body 310 (not illustrated). In this case, in one of the pair of first position restrictors 320a, the first portion of the restrictor body 322a' of the first position restrictor 320a extends rectilinearly or arcuately from the attaching portion 321a' attached to the X-direction-side portion of the edge portion 315a to the inside of the insertion port 315 (i.e. in the X' direction), and the second portion extends rectilinearly or arcuately in the Y direction from the Z'-direction end of the first portion (not illustrated). The first portion of the other restrictor body 322a' extends rectilinearly or arcuately from the attaching portion 321a' attached to the X'-direction-side portion of the edge portion 315a to the inside of the insertion port 315 (i.e. in the X direction), and the second portion of the other restrictor body 322a' extends rectilinearly or arcuately in the Y direction from the Z'-direction end of the first portion (not illustrated).

In each restrictor body 322a' of any of the above aspects, the corner where the first and second portions meet may preferably, but is not required to, form a chamfered face.

In another aspect, each restrictor body 322a' may be a piece member having only the first portion of any of the above aspects. In yet another aspect, each restrictor body 322a' may be a piece member formed by partly cutting out a portion of the attaching portion 321a' and bending the cut-out part to the inside of the insertion port 315 (to the Z'-direction side). In this case, each attaching portions 321a' may preferably be attached to an inner surface of the edge portion 315a of the shell body 310.

Each first position restrictor 320a' of any of the above aspects may preferably be positioned so as not to interfere with the electronic component 200 when the circuit board 100 and the electronic component 200 are inserted into the shell body 310 through the insertion port 315.

A pair of latch arms 330 of the connector C1' are configured similarly to the pair of latch arms 330 of the connector C1, except for the following difference. Arms 331 of the connector C1' extend in the Y direction inside the shell body 310 from the respective restricting bodies 322a' of the first position restrictors 320a' of any of the above aspects, are located on the Z-direction side with respect to the circuit board 100 housed inside the shell body 310, and are elastically deformable in the X-X' direction. In FIGS. 5A to 6B, the arms 331 of the latch arms 330 extend in the Y direction inside the shell body 310, respectively from the ends in the X- and X'-directions of the first portions of the restricting bodies 322a' of the first position restrictors 320a'.

In another aspect, the arms 331 may extend in the Y direction inside the shell body 310, not from the respective first position restrictor 320a' but from the edge portion 315a of the insertion port 315 of the shell body 310, be located on the Z-direction side with respect to the circuit board 100 housed in the shell body 310, and be elastically deformable in the X-X' direction.

The above-described connector C1' can be manufactured similarly to the connector C1, except for the steps below. In such manufacturing steps, however, it is preferable to prepare a shell 300 that includes the pair of first position restrictors 320a'.

The connector C1' and manufacturing methods thereof described above provide Technical Features and Effects 1, 3, and 4 of the connector C1 and the manufacturing methods thereof. In addition, the connector C1' and the manufacturing methods thereof can suppress a decrease in strength of the shell body 310 of the shell 300 for the following reasons. The pair of first position restrictors 320a' are separate members from the shell body 310. It is therefore unnecessary to cut out part of the edge portion 315a of the insertion port 315 in order to make the pair of first position restrictors 320a', suppressing the decrease in strength of the shell body 310. In addition, where the at least one third position restrictor of each of the pair of latch arms 330 comes into abutment with the first face 101 of the circuit board 100 during the insertion of the circuit board 100, it is unnecessary to cut out part of the shell body 310 in order to make each third position restrictor, suppressing the decrease in strength of the shell body 310. In addition, where the or each fifth position restrictor 320d is a protrusion protruding in the Z direction provided in the Z'-direction-side portion of the shell body 310, it is unnecessary to cut out part of the shell body 310 in order to make the or each fifth position restrictor 320d, and thus, the decrease in strength of the shell body 310 is suppressed.

Third Embodiment

Figure 7A:
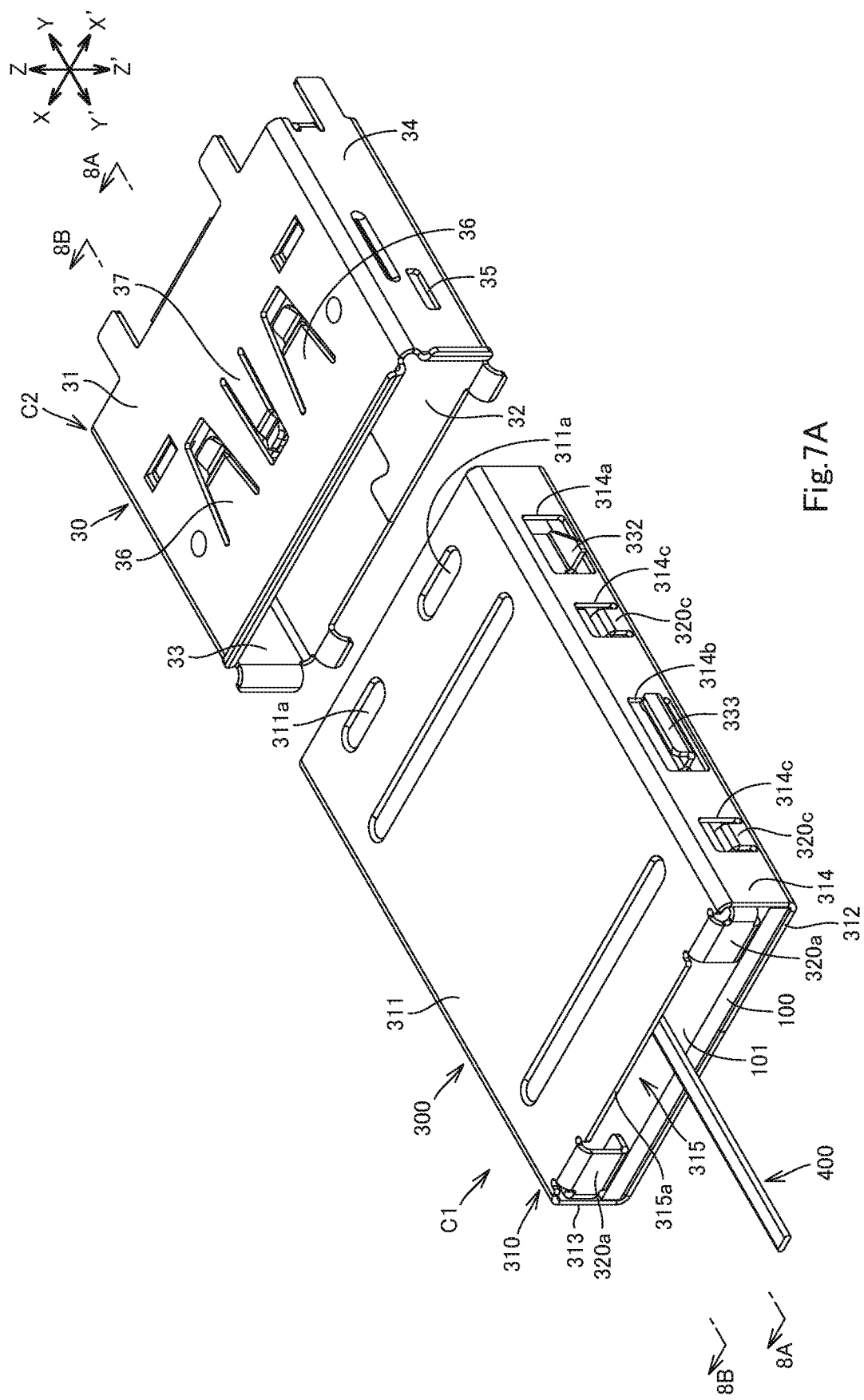
FIG. 7A is a perspective view of a connection structure of connectors according to a third embodiment of the invention, showing a state before connecting the two connectors of the connection structure.
Figure 7B:
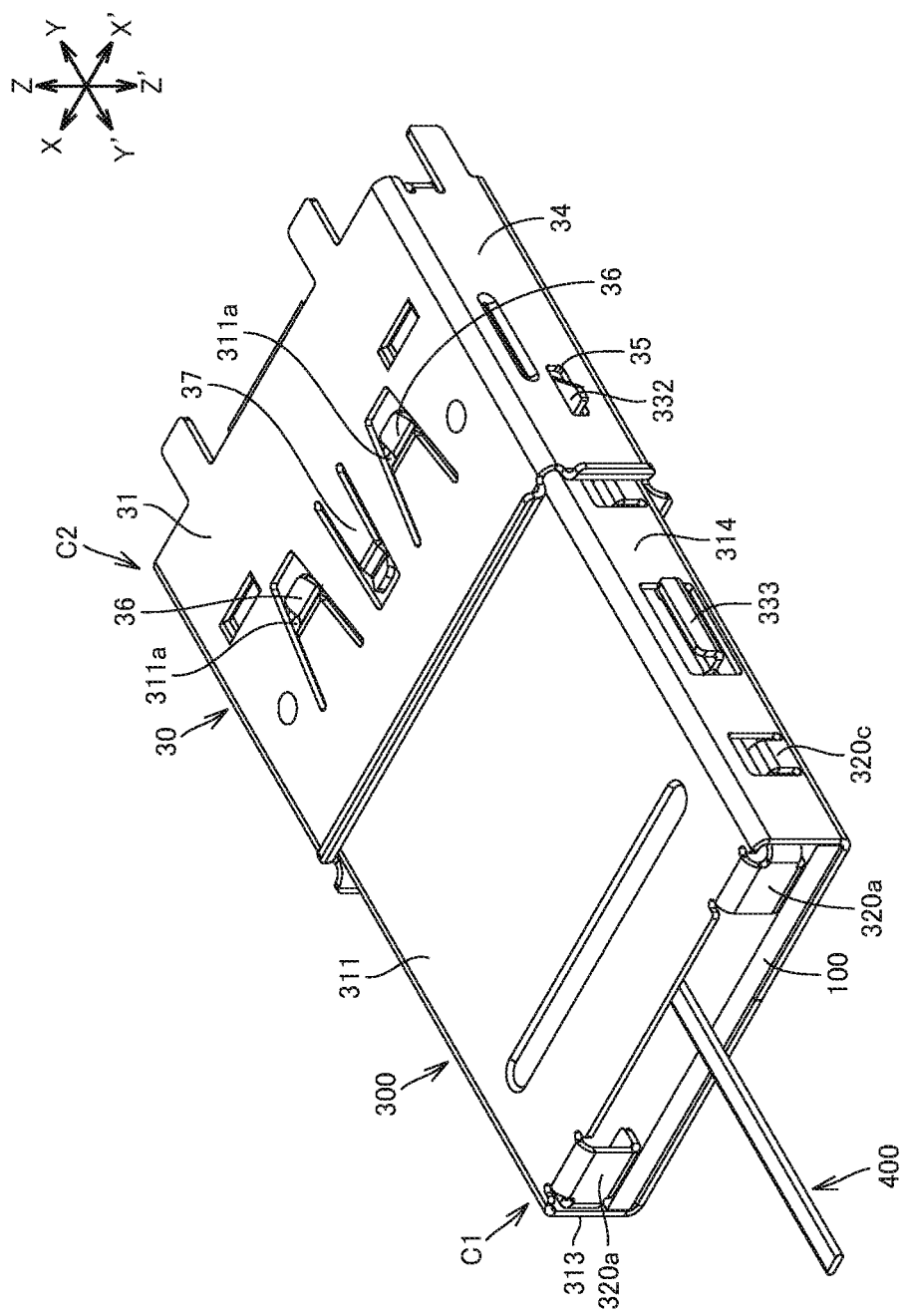
FIG. 7B is a perspective view of the connection structure of the connectors, showing a state where the two connectors are connected together.
Figure 8A:
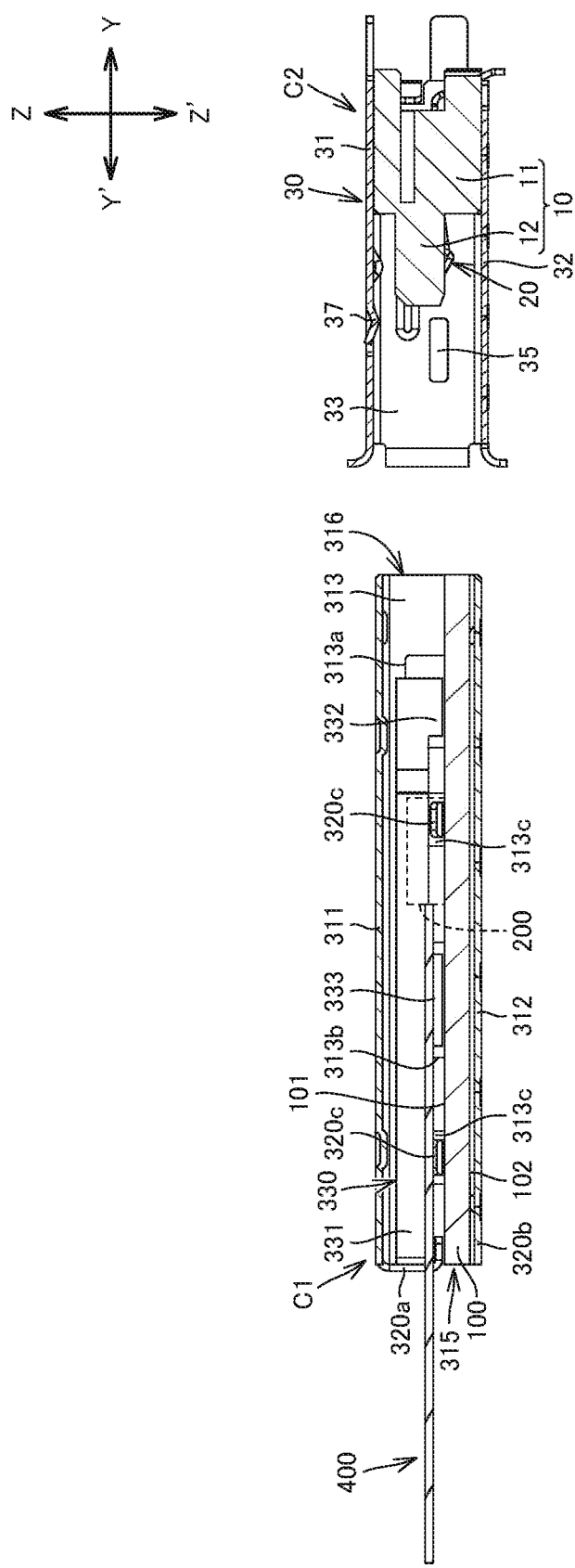
FIG. 8A is a cross-sectional view of the connection structure, taken along line 8A-8A in FIG. 7A.
Figure 8B:
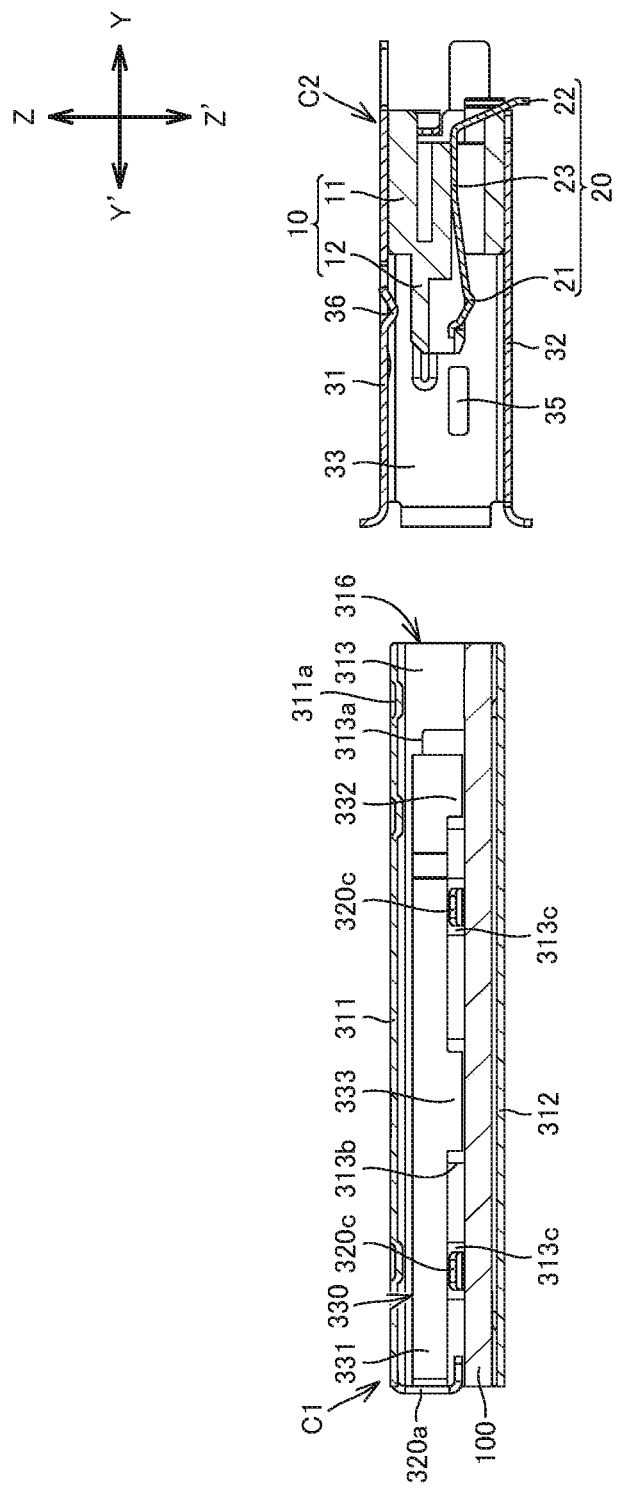
FIG. 8B is a cross-sectional view of the connection structure, taken along line 8B-8B in FIG. 7A.

The following is a description of a connection structure of connectors according to a plurality of embodiments, including a third embodiment of the invention, with reference to FIGS. 7A to 12. FIGS. 7A to 12 illustrate the connection structure of connectors according to the third embodiment. As in FIGS. 1A and 1B, Y-Y', Z-Z', and X-X' directions are indicated in FIGS. 7A and 7B. The Y-Y' and Z-Z' directions are indicated also in FIGS. 8A to 11B. The X-X' direction only needs to be substantially orthogonal to the Y-Y' direction and cross the Z-Z' direction.

The connection structure of connectors includes a connector C1 (first connector) and a connector C2 (second connector). The connector C1 is a connector of any of the above aspects. The connector C2 is an above-described mating connector to mate the connector C1. The connector C2 includes an insulative body 10, a plurality of terminals 20, and a shield shell 30 (which may also be referred to simply as the shell 30) (which corresponds to a second shield shell in the claims).

A shell body 310 of a shell 300 (corresponding to a first shield shell in the claims) of the connector C1 is insertable into, and removable from, the shell 30 of the connector C2 in the Y-Y' direction. For convenience of description, a relative position of the shell 300 with respect to the shell 30 in a state where the shell 300 has been inserted into the shell 30 will be referred to as a first position P1 (see FIGS. 11A and 11B), and a course from a start position of the shell 300 in the insertion with respect to the shell 30 to the first position P1 will be referred to as an insertion course (see FIGS. 9A to 11B). The insertion course includes the insertion start position and the first position P1.

Conforms to the outer shape of the shell 300 of the connector C1, the shell 30 of the connector C2 has a substantially tubular shape (for example, a polygonal section tube, a circular section tube, a polygonal section tube with a cutout extending from an end in the Y direction to an end of Y' (having a substantially angular C-shaped section in the Z-Z' direction), or a substantially circular section tube with a cutout extending from an end in the Y direction to an end of Y' (having a substantially C-shaped section in the Z-Z' direction). The shell 30 extends in the Y-Y' direction. The shell 30 may be made of a metal plate, or may be made of resin with metal evaporated on an outer or inner surface thereof. In FIGS. 7A to 11B, the shell 30 is a square section tube and has a first plate 31 on the Z-direction side, a second plate 32 on the Z'-direction side, a third plate 33 on the X-direction side, and a fourth plate 34 on the X'-direction side. The shell 30 of the connector C2 is to be connected to a frame ground, a ground electrode of a circuit board, or the like and thereby grounded.

The shell 30 of the connector C2 houses the body 10 and the terminals 20 held by the body 10. Each of the terminals 20 includes a contact portion 21, a tail portion 22, and an intermediate portion 23. The intermediate portions 23 are respectively provided between the contact portions 21 and the tail portions 22 of the terminals 20, and held by the body 10 at spaced intervals along the X-X' direction. The contact portions 21 may preferably be exposed or protruded from the body 10 so as to be contactable with electrodes 110 of the connector C1. The tail portions 22 may preferably protrude from the body 10, on the opposite side to the contact portions 21.

In FIGS. 8A to 11B, the body 10 includes a base 11 and a tongue 12. The base 11 is held inside the shell 30. The tongue 12 is a generally flat plate having a dimension in the Z-Z' direction smaller than that of the base 11, and extends from the base 11 in the Y' direction inside the shell 30. The intermediate portions 23 of the terminals 20 are held by the base 11 at spaced intervals along the X-X' direction. The contact portions 21 of the terminals 20 protrudes from the tongue 12 in the Z' direction. The tail portions 22 of the terminals 20 protrude from the base 11 in the Y direction.

In the insertion course, the contact portions 21 of the terminals 20 and a portion of the body 10 (the tongue 12 in FIGS. 11A and 11B) are inserted into the shell body 310 through a connection port 316 of the connector C1, and the contact portions 21 of the terminals 20 are brought into elastic contact, at the first position P1, respectively with the electrodes 110 of the connector C1 inside the shell body 310. This establishes electrical connection between the connector C1 and the connector C2.

The shell 300 of the connector C1 includes a pair of latch arms 330 of any of the above aspects. The pair of latch arms 330 includes one latch arm 330 and the other latch arm 330. Engaging portions 332 of the one and other latch arms 330 are claws protruding in the X and X' directions, respectively. The shell 30 of the connector C2 has a pair of engagement holes 35. The pair of engagement holes 35 include one engagement hole 35 and the other engagement hole 35. The one engagement hole 35 is provided in an X-direction-side portion of the shell 30, and the other engagement hole 35 is provided in an X'-direction-side portion of the shell 30. In FIGS. 7A to 11B, the one engagement hole 35 is provided in the third plate 33 of the shell 30, and the other engagement hole 35 is provided in the fourth plate 34 of the shell 30.

One of the two shells, namely the shell 300 of the connector C1 or the shell 30 of the connector C2, further includes a plurality of lock portions 311a, and the other shell further includes a plurality of half-lock springs 36.

The lock portions 311a may be blind holes or through-holes provided in an opposing face of the one shell. Alternatively, the lock portions 311a may be protrusions provided on the opposing face of the one shell and protruding toward the other shell. The opposing face of the one shell herein means a face that opposes the other shell in the insertion course and at the first position P1.

Each of the half-lock springs 36 is formed by cutting out part of the other shell. Each half-lock spring 36 includes a spring portion and a locking protrusion. Each spring portion may preferably extend in the Y-Y' direction and includes a fixed end and a free end. The fixed end of each spring portion is contiguous with the other shell. Each locking protrusion is provided at the free end of the corresponding spring portion and protrudes toward the one shell. For example, where each half-lock spring 36 is provided in the shell 30 (which is the other shell), the locking protrusion thereof may preferably protrude inward (toward the shell 300 (which is the one shell)), further than the inner face of the spring portion and/or that of the shell 30. Where each half-lock spring 36 is provided in the shell 300 (which is the other shell), the locking protrusion thereof may preferably protrude outward (toward the shell 30 (which is the one shell)), further than the outer surface of the spring portion and/or that of the shell 300.

In FIGS. 7A to 11B, the lock portions 311a are blind holes provided in the outer surface (opposing face) of the first plate 311 of the shell 300 at spaced intervals along the X-X' direction, and the half-lock springs 36 are formed by cutting out part of the first plate 31 of the shell 30 at spaced intervals along the X-X' direction. In each half-lock spring 36, the fixed end is contiguous with the first plate 31, and the spring portion, from the fixed end to the locking protrusion, extends in the Y direction. Each locking protrusion protrudes inward (toward the shell 300 (to the Z'-direction side)), further than the inner surface of the spring portion and that of the inner surface of the first plate 31 of the shell 30.

The one or other shell may further include a grounding contact spring 37 (which may also be referred to simply as the contact spring 37). The contact spring 37 is formed by cutting out part of the one or other shell. The contact spring 37 includes a spring portion and a contacting protrusion. The spring portion may preferably extend in the Y-Y' direction and includes a fixed end and a free end. The fixed end of the spring portion is contiguous with the one or other shell. The contacting protrusion is provided at the free end of the spring and protrudes toward the other shell or the one shell. For example, where the contact spring 37 is provided in the shell 30, the contacting protrusion may preferably protrude inward (toward the shell 300 (which is the one shell)), further than the inner surface of the spring portion and/or that of the shell 30. Where the contact spring 37 is provided in the shell 300 (which is the other shell), the contacting protrusion may preferably protrude outward (toward the shell 30 (which is the one shell)), further than the outer surface of the spring portion and/or that of the shell 300.

In FIGS. 7A to 11B, the contact spring 37 is formed by cutting out a part between the half-lock springs 36 of the first plate 31 of the shell 30. In the contact spring 37, the fixed end is contiguous with the first plate 31, and the spring portion, from the fixed end to the contacting protrusion, extends in the Y' direction. The contacting protrusion protrudes inward (toward the shell 300 (to the Z'-direction side)), further than the inner surface of the spring portion and that of the inner surface of the first plate 31 of the shell 30. The contact spring 37 may be omitted.

With regard to the engaging portions 332 of the one and the other latch arms 330 in the insertion course, from when coming into contact respectively with distal ends (ends in the Y' direction) of the X- and X'-direction-side portions (the third plate 33 and the fourth plate 34 in FIGS. 7A to 11B) of the shell 30 until being inserted respectively into the engagement holes 35, the arms 331 of the one and the other latch arms 330 elastically deform in the X' and X directions, and the engaging portions 332 of the one and the other latch arms 330 make elastic contact respectively with the X- and X'-direction-side portions of the shell 30 from the X'- and X-direction sides, respectively.

With regard to the half-lock springs 36 of the other shell in the insertion course, from when coming into contact with the distal end of the one shell until being locked respectively in the lock portions 311a, the spring portions of the half-lock springs 36 elastically deform away from the one shell, and the locking protrusions of the half-lock springs 36 make elastic contact with the one shell. It should be noted that where the half-lock springs 36 are provided in the shell 30, the distal end of the one shell is the end on the Y-direction side of the shell 300, while where the half-lock springs 36 are provided in the shell 300, the distal end of the one shell is the end on the Y'-direction side of the shell 30.

Where the one or other shell is provided with the contact spring 37, the contact spring 37 in the insertion course is such that the spring portion of the contact spring 37 elastically deforms away from the other shell or the one shell, and the contacting protrusion of the contact spring 37 makes elastic contact with the other shell or the one shell.

For convenience of description, a second position P2 refers to a relative position of the shell 300 with respect to the shell 30 when the engaging portions 332 of the one and other latch arms 330 make contact with the distal ends of the X- and X'-direction-side portions of the shell 30. A third position P3 refers to a position where the contact spring 37 makes contact with the distal end of the other shell or the one shell (see FIGS. 9A and 9B). A fourth position P4 refers to a relative position of the shell 300 with respect to the shell 30 when the half-lock springs 36 make contact with the distal end of the one shell (see FIGS. 10A and 10B). The second position P2 to the fourth position P4 are included in the insertion course. Where the contact spring 37 is omitted, the third position P3 is also omitted.

At the second position P2, when the engaging portions 332 of the one and the other latch arms 330 start contacting the distal ends in the X- and X'-direction-side portions of the shell 30, the contact spring 37 may preferably be located so as not to make contact with the other shell or the one shell. In other words, it may be before the contact spring 37 makes contact with the other shell or the one shell that the engaging portions 332 of the one and the other latch arms 330 make contact with the distal portions of the X- and X'-direction-side portions of the shell 30. This can be embodied as (A) or (B) described below, for example.

(A) Where the one and the other latch arms 330 are provided in the shell 300 and the contact spring 37 is provided in the shell 30, at a position where the engaging portions 332 of the one and the other latch arms 330 start contacting the distal ends of the X- and X'-direction-side portions of the shell 30, the contacting protrusion of the contact spring 37 may preferably be arranged at a position so as not to make contact with the distal end of the shell 300.

(B) Where the one and the other latch arms 330 and the contact spring 37 are provided in the shell 300, positions in the Y-Y' direction of the engaging portions 332 of the one and the other latch arms 330 are on the Y-direction side with respect to the position in the Y-Y' direction of the contacting protrusion of the contact spring 37.

At the third position P3, when the contact spring 37 starts contacting the other shell or the one shell, the locking protrusions of the half-lock springs 36 may preferably be arranged so as not to make contact with the one shell. In other words, it may preferably be before the half-lock springs 36 make contact with the distal end of the one shell that the contact spring 37 make elastic contact with the other shell or the one shell (see FIGS. 9A and 9B). This can be embodied as one of (1) to (4) described below, for example.

(1) Where the half-lock springs 36 and the contact spring 37 are provided in the shell 30, the position in the Y-Y' direction of the contacting protrusion of the contact spring 37 is on the Y'-direction side with respective to the positions in the Y-Y' direction of the locking protrusions of the half-lock springs 36. In this case, the contact spring 37 and the half-lock springs 36 may extend oppositely in the Y-Y' direction.

(2) Where the half-lock springs 36 and the contact spring 37 are provided in the shell 300, the position in the Y-Y' direction of the contacting protrusion of the contact spring 37 is on the Y-direction side with respective to the positions in the Y-Y' direction of the locking protrusions of the half-lock springs 36. In this case, the contact spring 37 and the half-lock springs 36 may extend oppositely in the Y-Y' direction.

(3) Where the half-lock springs 36 are provided in the shell 30 and the contact spring 37 is provided in the shell 300, at a position where the contacting protrusion of the contact spring 37 starts contacting the shell 30, the locking protrusions of the half-lock springs 36 may preferably be arranged at the positions so as not to make contact with the distal end of the shell 300.

(4) Where the half-lock springs 36 are provided in the shell 300 and the contact spring 37 is provided in the shell 30, at a position where the contacting protrusion of the contact spring 37 starts contacting the shell 300, the locking protrusions of the half-lock springs 36 may preferably be arranged at the positions so as not to make contact with the distal end of the shell 30.

Figure 10B:
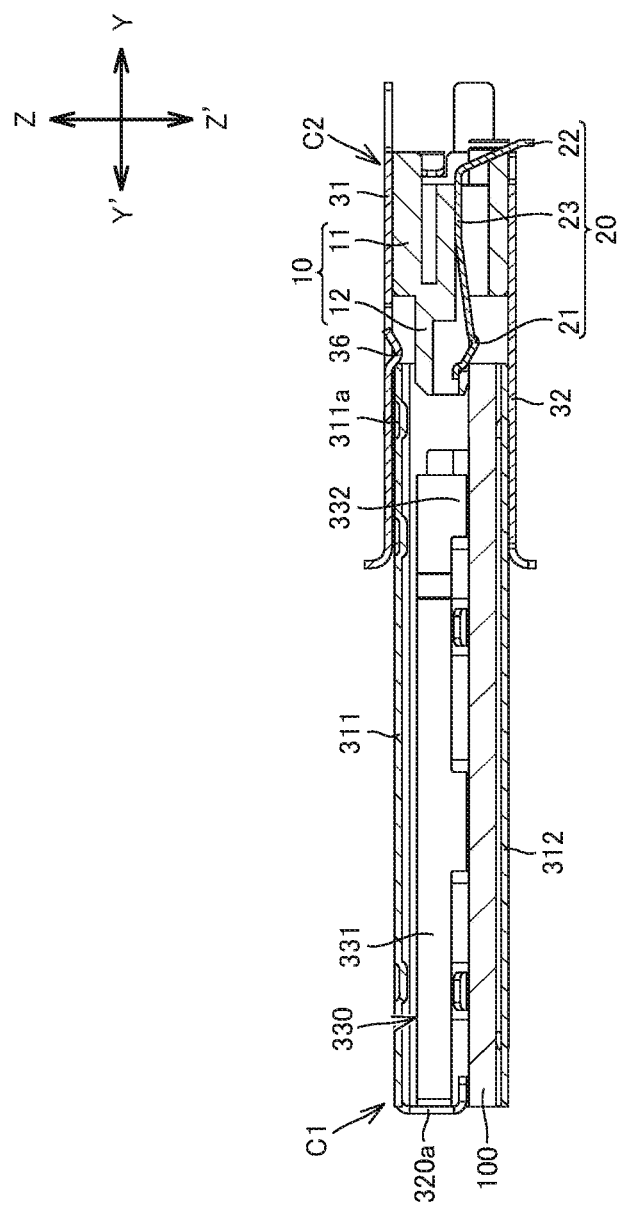
FIG. 10B is a cross-sectional view of the connection structure, taken along line 8B-8B in FIG. 7A, showing a state where at least one half-lock spring has contacted the distal portion of the shell of the one connector and substantially simultaneously the terminal of the other connector has elastically contacted the circuit board of the one connector while the one connector is being inserted into the other connector.
Figure 11A:
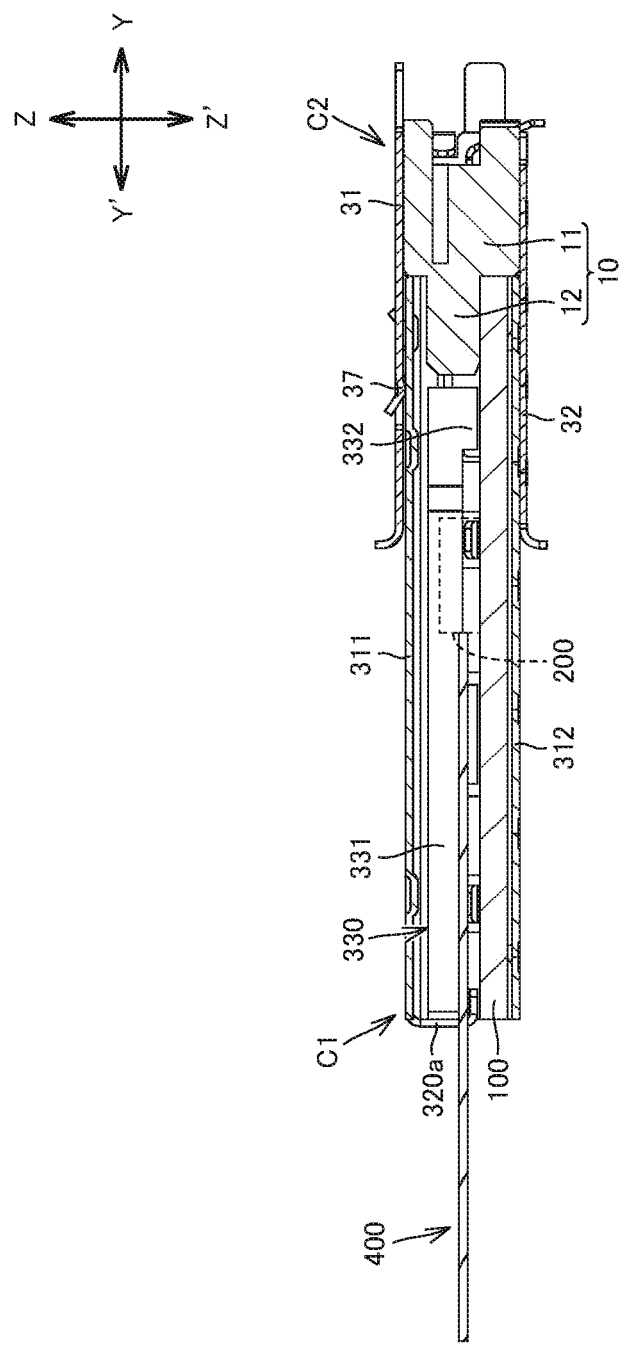
FIG. 11A is a cross-sectional view of the connection structure, taken along line 8A-8A in FIG. 7A, showing a state where the two connectors are connected together.
Figure 11B:
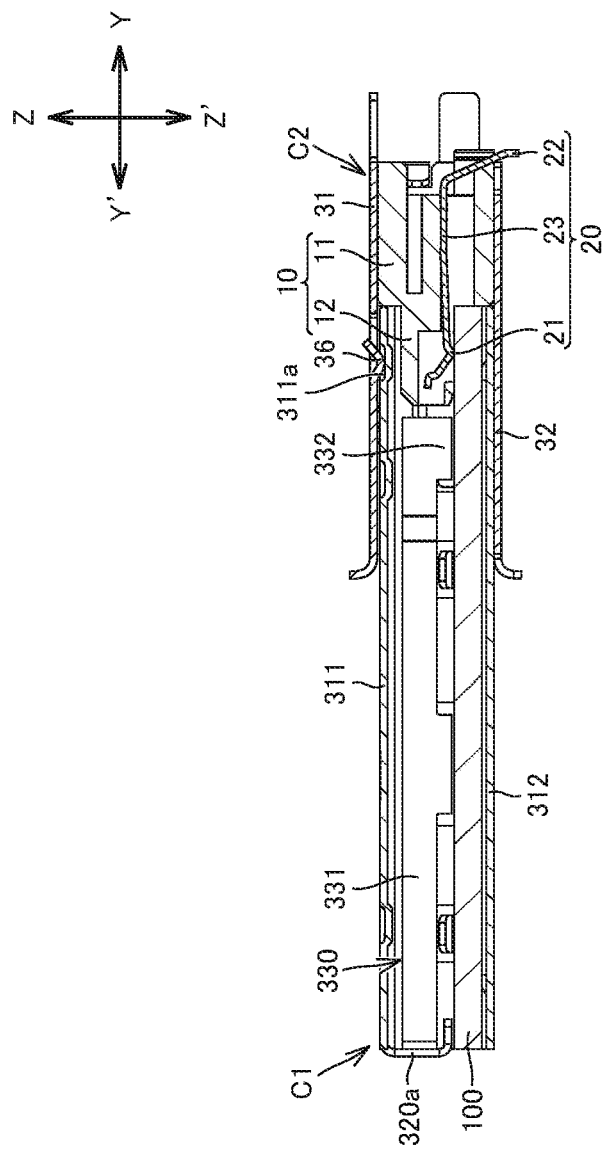
FIG. 11B is a cross-sectional view of the connection structure taken along line 8B-8B in FIG. 7A, showing a state where the two connectors are connected together.

Further, it may be configured such that at the fourth position P4, the half-lock springs 36 make contact with the distal end of the one shell (see FIG. 10A) and substantially simultaneously the terminals 20 make contact with the circuit board 100 of the connector C1 (see FIG. 10B). More specifically, where the half-lock springs 36 are provided in the shell 30, the locking protrusions of the half-lock springs 36 are substantially at the same positions in the Y-Y' direction as the portions of the contact portions 21 of the terminals 20 that are exposed or protrude from the body 10 as illustrated in FIGS. 10A and 10B. Where the half-lock springs 36 are provided in the shell 300, the locking protrusions of the half-lock springs 36 may preferably be arranged so as to make contact with the distal end of the shell 30 at a position where the portions of the contact portions 21 of the terminals 20 that are exposed or protrude from the body 10 start contacting the circuit board 100 of the connector C1.

Where the lock portions 311*a* are the above-described blind holes or through-holes, at the first position P1, the engaging portions 332 of the one and the other latch arms 330 are inserted respectively into the one and the other engagement holes 35 from the X'- and X-direction sides, respectively, the arms 331 of the one and the other latch arms 330 restore themselves (see FIG. 7B), and the locking protrusions of the half-lock springs 36 are fitted (locked) into the lock portions 311*a* (see FIG. 11B).

Where the lock portions 311*a* are the above-described protrusions, at the first position P1, the engaging portions 332 of the one and the other latch arms 330 are inserted respectively into the one and the other engagement holes 35 from the X'- and X-direction sides, respectively, the arms 331 of the one and the other latch arms 330 restore themselves (see FIG. 7B), and the locking protrusions of the half-lock springs 36 ride up and over the lock portions 311*a* to be caught (locked) against the lock portions 311*a*.

In this manner, the engaging portions 332 of the pair of latch arms 330 are inserted into the pair of engagement holes 35, and the half-lock springs 36 are locked with the lock portions 311*a*, so that the connector C1 and the connector C2 are mechanically connected together.

While locked with the lock portions 311*a*, the half-lock springs 36 keep their elastic contact with the one shell. The half-lock springs 36 are released from their elastic contact with the one shell when the shell 300 of the connector C1 is removed from the shell 30 of the connector C2.

It is preferable but not required that a sound be generated by at least one of the following: the insertion of the engaging portions 332 of the latch arms 330 into the engagement holes 35, or the locking of the half-lock springs 36 with the lock portions 311*a*. This sound may preferably be generated by at least one of the following, for example: the elastic contacting of the arms 331 and/or the engaging portions 332 of the latch arms 330 respectively with the edges of the engagement hole 35, or the elastic contacting of the half-lock springs 36 respectively with the lock portions 311*a*.

Where the contact spring 37 is provided in the one or other shell, the contacting protrusion of the contact spring 37 at the first position P1 is continuously in elastic contact with the other shell or the one shell. In other words, the spring portion of the contact spring 37 remains elastically deformed away from the other shell or the one shell. The elastic contact of the contact spring 37 with the other shell or the one shell is released when the shell 300 of the connector C1 is removed from the shell 30 of the connector C2.

(A1) When the contact spring 37 makes elastic contact with the other shell or the one shell, a load is applied to the other shell or the one shell. This load (which may be referred to as a first load) may preferably be smaller than a load (which may be referred to as a second load) applied to the one shell when the half-lock spring 36 makes elastic contact with the one shell.

(A2) The first load may be not greater than one quarter of the second load.

In aspect (A1) or (A2), it is preferable to set the elastic force of the contact spring 37 to be smaller than the elastic force of each of the half-lock springs 36, and/or to set the amount of protrusion of the contacting protrusion of the contact spring 37 of the contact spring 37 to be smaller than the amount of protrusion of each of the locking protrusions of the half-lock springs 36.

(B) The first load may be the minimum load required to make the one or other shell that has the contact spring 37 be electrically continuous with, and electrically grounded to, the other shell or the one shell by bringing the contact spring 37 into elastic contact with the other shell or the one shell. For example, the first load may preferably be 1N to 3N, where the one or other shell that has the contact spring 37, and the other shell or the one shell, are subjected to Sn plating (tin plating), and where the elastic contact of the contact spring 37 with the other shell or the one shell is elastic contact between the Sn-plated (tin-plated) parts.

The following discussion is directed to a method for connecting the connector C1 to the connector C2 in case (1) where the half-lock springs 36 and the contact spring 37 are provided in the shell 30 of the connector C2 and the lock portions 311a are provided in the shell 300 of the connector C1.

Figure 12:
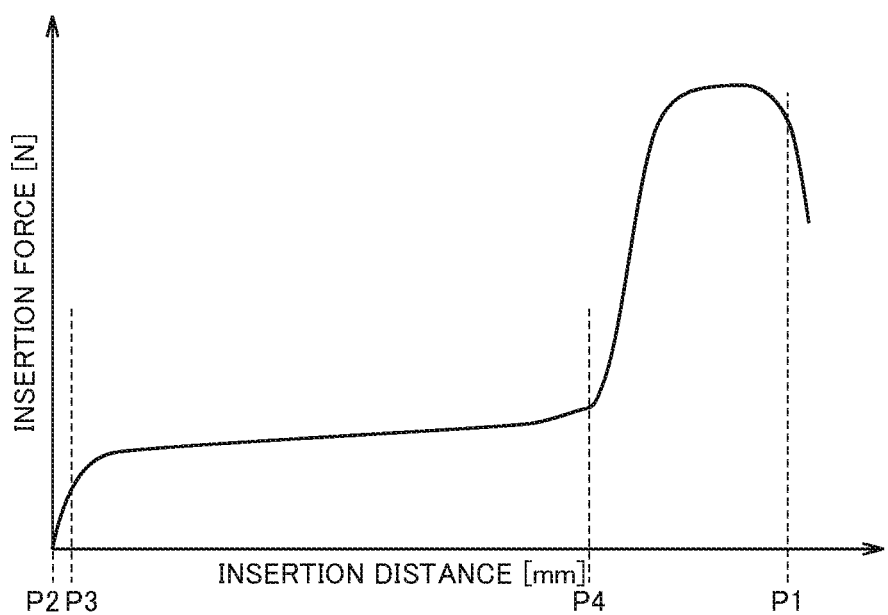
FIG. 12 is a graph illustrating the insertion distance traveled by the one connector of the connection structure toward the other connector while the one connector is being inserted into the other connector, and the relationship between the insertion distance and the insertion force required for the insertion.

Initiate the insertion in the Y-Y' direction of the shell body 310 of the shell 300 of the connector C1 into the shell 30 of the connector C2. Thereafter, the shell body 310 of the shell 300 of the connector C1 reaches the second position P2 with respect to the shell 30 of the connector C2, and the engaging portions 332 of the one and the other latch arms 330 of the connector C1 come into contact respectively with the distal ends of the X- and X'-direction-side portions of the shell 30. Thereafter, further progresses the insertion of the shell body 310 of the connector C1 into the shell 30 of the connector C2, from the second position P2 to the third position P3. At this time, the one and the other latch arms 330 are pressed respectively by the X- and X'-direction-side portions of the shell 30 of the connector C2 and elastically deformed respectively in the X' and X directions. As such, it is from the second position P2 that the engaging portions 332 of the one and the other latch arms 330 are brought into elastic contact with the shell 30 of the connector C2 (apply loads to the shell 30). This increases an insertion force to insert the shell body 310 of the shell 300 of the connector C1 into the shell 30 of the connector C2 as illustrated in FIG. 12.

Figure 9A:
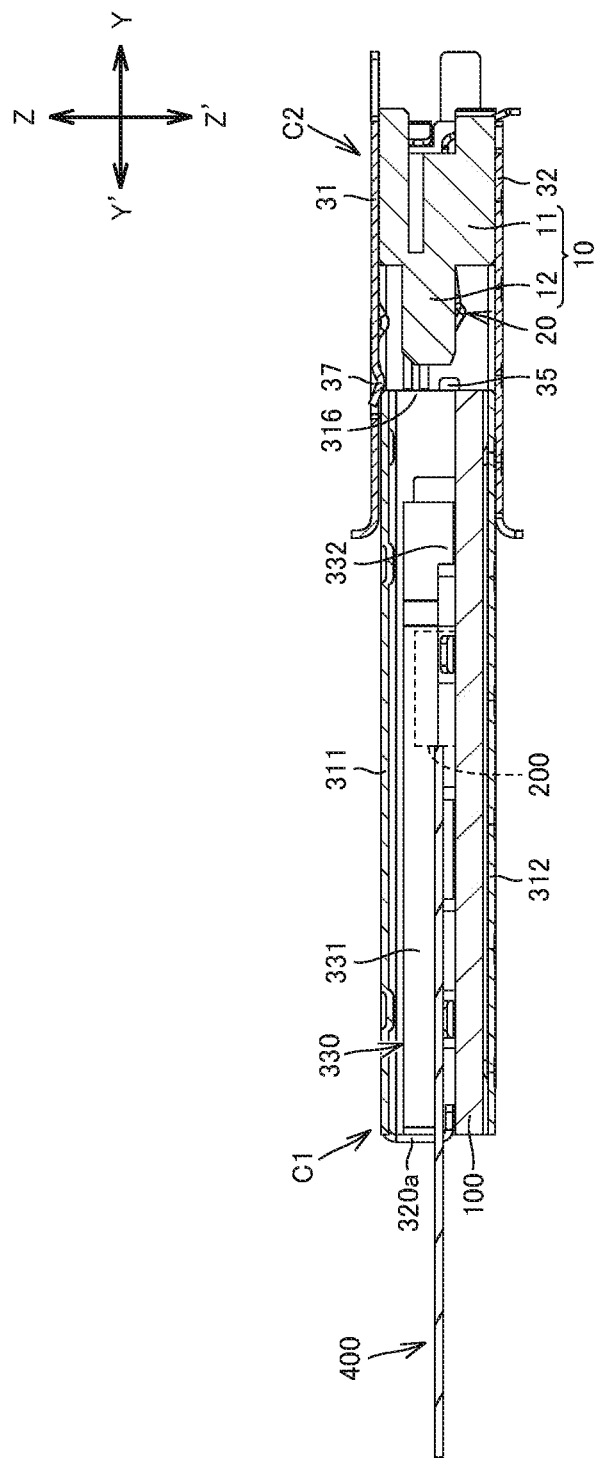
FIG. 9A is a cross-sectional view of the connection structure, taken along 8A-8A in FIG. 7A, showing a state where at least one contact spring has contacted a distal portion of a shell of one of the two connectors while the one connector is being inserted into the other connector.
Figure 9B:
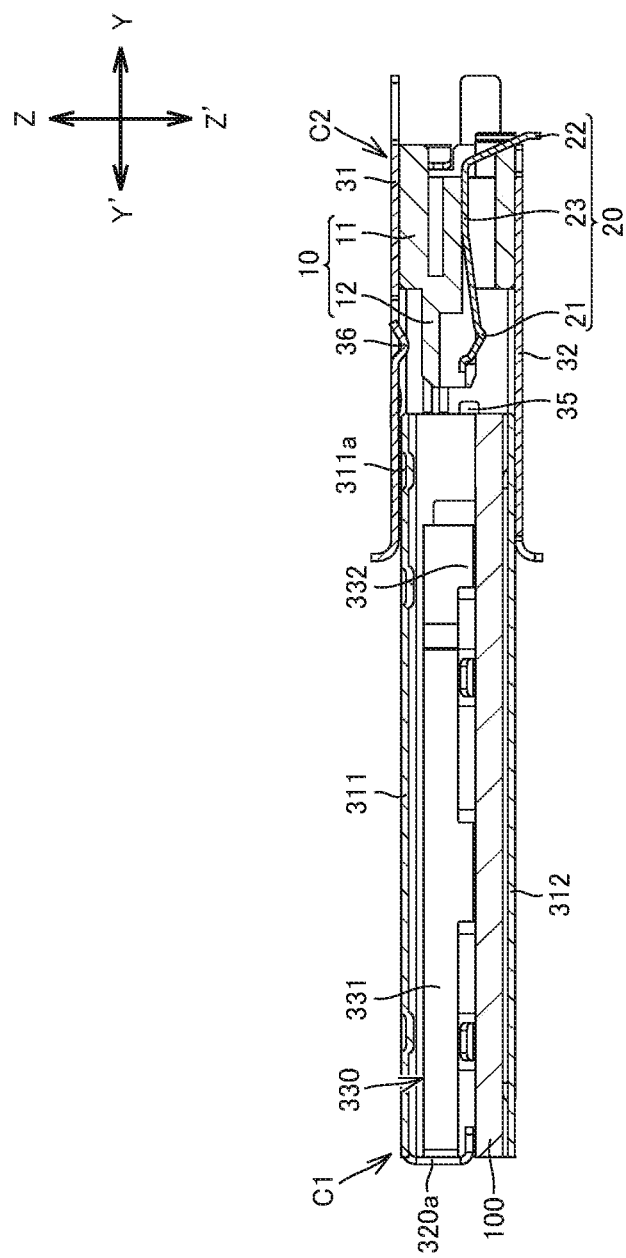
FIG. 9B is a cross-sectional view of the connection structure, taken along line 8B-8B in FIG. 7A, showing a state where the at least one contact spring has contacted the distal portion of the shell of the one connector while the one connector is being inserted into the other connector.

Thereafter, the shell body 310 of the shell 300 of the connector C1 reaches the third position P3 with respect to the shell 30 of the connector C2, and the contact spring 37 of the connector C2 makes contact with the distal end of the shell 300 of the connector C1 before the half-lock springs 36 of the connector C2 make contact with the distal end (end in the Y direction) of the shell 300 of the connector C1 (see FIGS. 9A and 9B). Thereafter, further progress the insertion of the shell body 310 of the connector C1 into the shell 30 of the connector C2, from the third position P3 to the fourth position P4. At this time, the spring portion of the contact spring 37 elastically deforms away from the shell 300 of the connector C1, and the contact spring 37 makes elastic contact with the shell 300 of the connector C1 (applies load to the shell 300). Thus, the elastic contact of the contact spring 37 is added to the above-described elastic contact of the one and the other latch arms 330, so that the insertion force further increases gently, as illustrated in FIG. 12.

Thereafter, the shell body 310 of the shell 300 of the connector C1 reaches the fourth position P4 with respect to the shell 30 of the connector C2, the half-lock springs 36 of the connector C2 make elastic contact with the distal end (end in the Y direction) of the shell 300 of the connector C1, and substantially simultaneously the contact portions 21 of the terminals 20 of the connector C2 make elastic contact with the circuit board 100 of the connector C1. Thereafter, further progress the insertion of the shell body 310 of the connector C1 into the shell 30 of the connector C2, from the fourth position P4 to the first position P1. At this time, the half-lock springs 36 elastically deform away from the shell 300 of the connector C1, and the half-lock springs 36 make elastic contact with the shell 300 of the connector C1 (apply load to the shell 300); while the terminals 20 elastically deform, and the contact portions 21 of the terminals 20 make elastic contact with the circuit board 100 (apply loads to the circuit board 100 of the connector C1). Thus, the elastic contact of the half-lock springs 36 and the elastic contact of the terminals 20 are added to the above-described elastic contact of the one and the other latch arms 330 and the above-described elastic contact of the contact spring 37, so that the insertion force sharply increases as illustrated in FIG. 12.

Thereafter, the shell body 310 of the shell 300 of the connector C1 reaches the first position P1 with respect to the shell 30 of the connector C2. Then the engaging portions 332 of the one and the other latch arms 330 are inserted into the engagement holes 35 of the shell 30 of the connector C2, the arms 331 of the one and the other latch arms 330 restore themselves, and substantially simultaneously the half-lock springs 36 are locked with the lock portions 311a of the shell 300 of the connector C1. Also, the contact portions 21 of the terminals 20 of the connector C2 make elastic contact respectively with the electrodes 110 of the circuit board 100 of the connector C1. As the engaging portions 332 of the one and the other latch arms 330 are inserted into the engagement holes 35, the one and the other latch arms 330 will not make elastic contact with the shell 30 of the connector C2; and as the half-lock springs 36 are locked with the lock portions 311a of the shell 300 of the connector C1, the half-lock springs 36 elastically contact more softly with the shell 300 of the connector C1. As a result, the insertion force sharply decreases as illustrated in FIG. 12. In this manner, the connectors C1 and C2 are electrically and mechanically connected together to form the connection structure.

The following discussion is directed to a method for connecting the connector C1 to the connector C2 in case (2) where the half-lock springs 36 and the contact spring 37 are provided in the shell 300 of the connector C1 and the lock portions 311a are provided in the shell 30 of the connector C2.

The connection method of (1) described above applies from the start of insertion of the shell 300 of the connector C1 into the shell 30 of the connector C2, through the second position P2, and to the third position P3.

The shell body 310 of the shell 300 of the connector C1 reaches the third position P3 with respect to the shell 30 of the connector C2, and the contact spring 37 of the connector C1 makes contact with the distal end of the shell 30 of the connector C2 before the half-lock springs 36 of the connector C1 make contact with the distal end (end in the Y' direction) of the shell 30 of the connector C2. Thereafter, further progress the insertion of the shell body 310 of the connector C1 into the shell 30 of the connector C2, from the third position P3 to the fourth position P4. At this time, the spring portion of the contact spring 37 elastically deforms away from the shell 30 of the connector C2, and the contact spring 37 makes elastic contact with the shell 30 of the connector C2 (applies load to the shell 30). Thus, the elastic contact of the contact spring 37 is added to the above-described elastic contact of the one and the other latch arms 330, so that the insertion force increases gently.

Thereafter, the shell body 310 of the shell 300 of the connector C1 reaches the fourth position P4 with respect to the shell 30 of the connector C2, the half-lock springs 36 of the connector C1 make elastic contact with the distal end (end in the Y' direction) of the shell 30 of the connector C2, and substantially simultaneously the contact portions 21 of the terminals 20 of the connector C2 make elastic contact with the circuit board 100 of the connector C1. Thereafter, further progress the insertion of the shell body 310 of the connector C1 into the shell 30 of the connector C2, from the fourth position P4 to the first position P1. At this time, the half-lock springs 36 elastically deform away from the shell 30 of the connector C2, the half-lock springs 36 make elastic contact with the shell 30 of the connector C2 (apply the load to the shell 30); while the terminals 20 elastically deform, and the contact portions 21 of the terminals 20 make elastic contact with the circuit board 100 (apply load to the circuit board 100 of the connector C1). Thus, the elastic contact of the half-lock springs 36 and the elastic contact of the terminals 20 are added to the above-described elastic contact of the one and the other latch arms 330 and the above-described elastic contact of the contact spring 37, so that the insertion force sharply increases.

Thereafter, the shell body 310 of the shell 300 of the connector C1 reaches the first position P1 with respect to the shell 30 of the connector C2. Then the engaging portions 332 of the one and the other latch arms 330 are inserted into the engagement holes 35 of the shell 30 of the connector C2, the arms 331 of the one and the other latch arms 330 restore themselves, and substantially simultaneously the half-lock springs 36 are locked with the lock portions 311a of the shell 30 of the connector C2. Also, the contact portions 21 of the terminals 20 of the connector C2 make elastic contact respectively with the electrodes 110 of the circuit board 100 of the connector C1. As the engaging portions 332 of the one and the other latch arms 330 are inserted into the engagement holes 35, the one and the other latch arms 330 will not make elastic contact with the shell 30 of the connector C2; and as the half-lock springs 36 are locked with the lock portions 311a of the shell 300 of the connector C1, the half-lock springs 36 elastically contact more softly with the shell 30 of the connector C2. As a result, the insertion force sharply decreases as illustrated in FIG. 12. In this manner, the connectors C1 and C2 are electrically and mechanically connected together to form the connection structure.

The following discussion is directed to a method for connecting the connector C1 to the connector C2 in case (3) where the half-lock springs 36 are provided in the shell 30 of the connector C2 and the lock portions 311a and the contact spring 37 are provided in the shell 300 of the connector C1.

The connection method of (1) described above applies from the start of insertion of the shell 300 of the connector C1 into the shell 30 of the connector C2, through the second position P2, and to the third position P3.

Thereafter, the shell body 310 of the shell 300 of the connector C1 reaches the third position P3 with respect to the shell 30 of the connector C2, and the contact spring 37 of the connector C1 makes contact with the distal end (end in the Y' direction) of the shell 30 of the connector C2 before the half-lock springs 36 of the connector C2 make contact with the distal end (end in the Y direction) of the shell 300 of the connector C1. Thereafter, further progress the insertion of the shell body 310 of the connector C1 into the shell 30 of the connector C2, from the third position P3 to the fourth position P4. At this time, the spring portion of the contact spring 37 elastically deforms away from the shell 30 of the connector C2, and the contact spring 37 makes elastic contact with the shell 30 of the connector C2 (applies load to the shell 30). Thus, the elastic contact of the contact spring 37 is added to the above-described elastic contact of the one and the other latch arms 330, so that the insertion force further increases gently. Thereafter, the connection method of (1) described above also applies to the subsequent insertion of the shell 300 of the connector C1 into the shell 30 of the connector C2, from the fourth position P4 to the first position P1.

The following discussion is directed to a method for connecting the connector C1 to the connector C2 in case (4) where the half-lock springs 36 are provided in the shell 300 of the connector C1 and the lock portions 311a and the contact spring 37 are provided in the shell 30 of the connector C2.

The connection method of (1) described above applies from the start of insertion of the shell 300 of the connector C1 into the shell 30 of the connector C2, through the second position P2, and to the third position P3.

Thereafter, the shell body 310 of the shell 300 of the connector C1 reaches the third position P3 with respect to the shell 30 of the connector C2, and the contact spring 37 of the connector C2 makes contact with the distal end (end in the Y direction) of the shell 300 of the connector C1 before the half-lock springs 36 of the connector C1 make contact with the distal end (end in the Y' direction) of the shell 30 of the connector C2. Thereafter, further progress the insertion of the shell body 310 of the connector C1 into the shell 30 of the connector C2, from the third position P3 to the fourth position P4. At this time, the spring portion of the contact spring 37 elastically deforms away from the shell 300 of the connector C1, and the contact spring 37 makes elastic contact with the shell 300 of the connector C1 (applies load to the shell 300). Thus, the elastic contact of the contact spring 37 is added to the above-described elastic contact of the one and the other latch arms 330, so that the insertion force further increases gently.

Thereafter, the shell body 310 of the shell 300 of the connector C1 reaches the fourth position P4 with respect to the shell 30 of the connector C2, the half-lock springs 36 of the connector C1 make elastic contact with the distal end (end in the Y' direction) of the shell 30 of the connector C2, and substantially simultaneously the contact portions 21 of the terminals 20 of the connector C2 make elastic contact with the circuit board 100 of the connector C1. Thereafter, further progress the insertion of the shell body 310 of the connector C1 into the shell 30 of the connector C2, from the fourth position P4 to the first position P1. At this time, the half-lock springs 36 elastically deform away from the shell 30 of the connector C2, and the half-lock springs 36 make elastic contact with the shell 30 of the connector C2 (apply load to the shell 30); while the terminals 20 elastically deform, and the contact portions 21 of the terminals 20 make elastic contact with the circuit board 100 (apply loads to the circuit board 100 of the connector C1). Thus, the elastic contact of the half-lock springs 36 and the elastic contact of the terminals 20 are added to the above-described elastic contact of the one and the other latch arms 330 and the above-described elastic contact of the contact spring 37, so that the insertion force sharply increases.

Thereafter, the shell body 310 of the shell 300 of the connector C1 reaches the first position P1 with respect to the shell 30 of the connector C2. Then the engaging portions 332 of the one and the other latch arms 330 are inserted into the engagement holes 35 of the shell 30 of the connector C2, the arms 331 of the one and the other latch arms 330 restore themselves, and substantially simultaneously the half-lock springs 36 are locked with the lock portions 311a of the shell 30 of the connector C2. Also, the contact portions 21 of the terminals 20 of the connector C2 make elastic contact respectively with the electrodes 110 of the circuit board 100 of the connector C1. As the engaging portions 332 of the one and the other latch arms 330 are inserted into the engagement holes 35, the one and the other latch arms 330 will not make elastic contact with the shell 30 of the connector C2; and as the half-lock springs 36 are locked with the lock portions 311a of the shell 30 of the connector C2, the half-lock springs 36 elastically contact more softly with the shell 30 of the connector C2. As a result, the insertion force sharply decreases. In this manner, the connectors C1 and C2 are electrically and mechanically connected together to form the connection structure.

The connection structure of the connector C1 and the connector C2 as described above provides the following technical features and effects.

Technical Feature and Effect (1): Workers can easily recognize that the connector C1 and the connector C2 have been electrically and mechanically connected together for the following reasons. If the timing at which the engaging portions of the latch arms are inserted into the engagement holes is different from the timing at which the at least one half-lock spring is locked with the lock portion, workers may incorrectly recognize that the two connectors have been connected together upon the insertion of the engaging portions of the latch arms into the engagement holes. This is in contrast with the present connection structure, in which at the first position P1, the engaging portions 332 of the one and the other latch arms 330 are inserted into the engagement holes 35 of the shell 300 of the connector C1 and substantially simultaneously the half-lock springs 36 are locked with the lock portions 311a. The insertion of the one and the other latch arms 330 into the engagement holes 35 and the locking of the half-lock springs 36 with the lock portions 311a will generate a click feel (tactile feel), which allows the workers to recognize that the connectors have been connected together.

Further, where a sound is generated by the insertion of the engaging portions 332 of the latch arms 330 into the engagement holes 35 and/or the locking of the half-lock springs 36 with the lock portions 311a, the sound makes it easier for the workers to recognize that the connectors have been connected together.

Further, where at the fourth position P4, the half-lock springs 36 of the connector C2 make elastic contact with the distal end (end in the Y' direction) of the shell 30 of the connector C2 and substantially simultaneously the contact portions 21 of the terminals 20 of the connector C2 make elastic contact with the circuit board 100 of the connector C1, it is from the fourth position P4 to the first position P1 that the half-lock springs 36 make elastic contact with the other shell and the terminals 20 make elastic contact with the circuit board 100. This means that at the fourth position P4, the elastic contacts of the half-lock springs 36 and the terminals 20 are added, and that at the first position P1, a greater click feel is generated by the insertion of the one and the other latch arms 330 into the engagement holes 35 (the elastic contact of the one and the other latch arms 330) and by the locking of the half-lock springs 36 with the lock portions 311a (the softer elastic contact of the half-lock springs 36). This click feel makes it easier for the workers to recognize the connection of the connectors.

In general, where a connector includes an optical fiber, such connector needs to be inserted into another connector slowly because the optical fiber is easily broken. When slowly connecting the connectors, if the timing at which the engaging portions of the latch arms are inserted into the engagement holes is different from the timing at which the at least one half-lock spring is locked with the lock portion, workers may incorrectly recognize that the connection of the connectors is completed upon the insertion of the engaging portions of the latch arms into the engagement holes. This is in contrast with the present connection structure, in which the insertion of the one and the other latch arms 330 into the engagement holes 35 and the locking of the half-lock springs 36 with the lock portions 311a will generate a click feel, which reduces the possibility, even when slowly connecting the connectors C1 and C2, that the workers incorrectly recognize that the connectors have been connected together.

Technical Feature and Effect (2): Where the contact spring 37 is provided in the one or other shell and the contact spring 37 makes elastic contact with the other shell or the one shell before the half-lock springs 36 of the other shell make contact with the distal end of the one shell (i.e., before the contact portions 21 of the terminals 20 are connected to the electrodes 110 of the circuit board 100), the first load is smaller than the second load. This means a weakened feel generated by the elastic contact of the contact spring 37 with the other shell or the one shell and reduces the possibility that the workers recognize such a feel incorrectly as the click feel described above. The feel can be further weakened by setting the first load to a value not greater than one quarter of the second load, or to the minimum load described above. In addition, the shells of the connectors are grounded before the connectors are electrically connected together.

It should be appreciated that the shield shells, the connectors, the connection structure of connectors, and the methods for manufacturing the connectors described above are not limited to the above embodiments but can be modified in any manner within a scope described in the claims as discussed below.

The shell body of the invention may be any shell including an insertion port opening in the Y' direction and an edge portion thereof. The connection port of the shell body of the invention may not open in the Y direction but in the Z or Z' direction. In other words, the shell body of the invention does not need to have a generally tubular shape.

The at least one second position restrictor of the invention may be a piece member extending from the edge portion of the insertion port of the shell body of any of the above aspects to the inside of the insertion port. For example, at least one second position restrictor 320b' may be a piece member having a generally L- or U-shaped cross section in the Z-Z' direction, and may have one of the following configurations 1) to 3).

Figure 13:
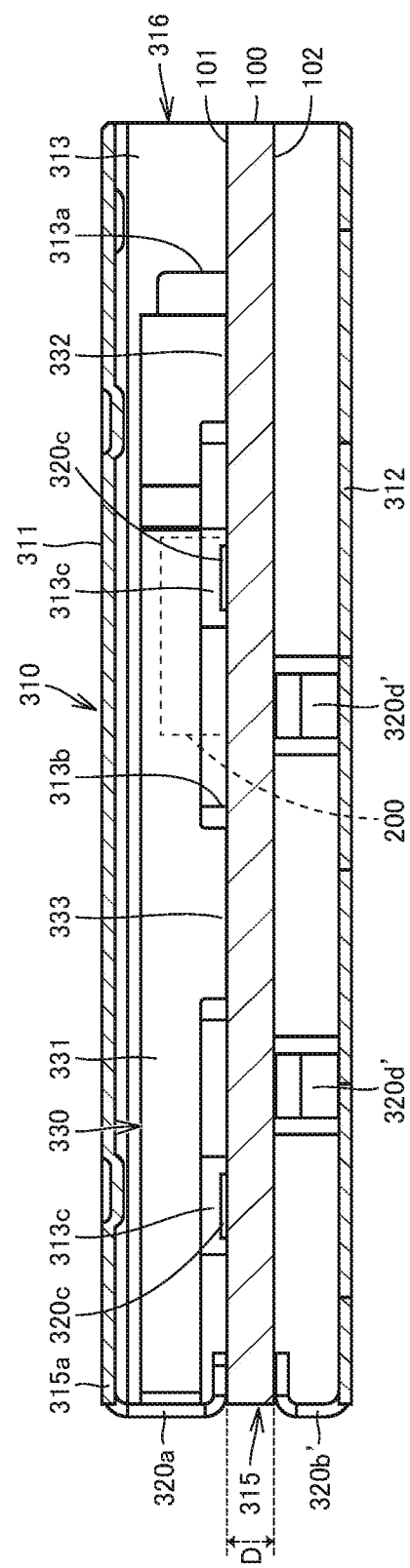
FIG. 13 is an enlarged cross-sectional view, corresponding to FIG. 2A, of a variant of the connector according to the first embodiment.

1) The or each second position restrictor 320b' includes a first portion extending rectilinearly or arcuately from an end in the Y' direction of a Z'-direction side portion (the second plate 312 in FIG. 13) of the edge portion 315a of the insertion port 315 of a shell body 310 to the inside of the insertion port 315 (in the Z direction). The at least one second position restrictor 320b' includes a second portion extending rectilinearly or arcuately in the Y direction from an end in the Z direction of the first portion (see FIG. 13).

2) The or each second position restrictor 320b' includes a first portion extending rectilinearly or arcuately from an end in the Y' direction of an X-direction-side portion of an edge portion 315a of an insertion port 315 of a shell body 310 to the inside of the insertion port 315 (in the X' direction). The at least one second position restrictor 320b' includes a second portion extending rectilinearly or arcuately in the Y direction from an end of the first portion in the Z direction.

3) The or each second position restrictor 320b' includes a first portion extending rectilinearly or arcuately from an end in the Y' direction of an X'-direction-side portion of an edge portion 315a of an insertion port 315 of a shell body 310 to the inside of the insertion port 315 (in the X direction). The at least one second position restrictor 320b' includes a second portion extending rectilinearly or arcuately in the Y direction from an end of the first portion in the Z direction.

In the or each second position restrictors 320b' of any of the above aspects, the corner where the first and second portions meet may preferably, but is not required to, form a chamfered face.

In another aspect, the or each second position restrictor 320b' may be a piece member having only the first portion of any of the above aspects. In yet another aspect, the or each second position restrictor 320b' may be a piece member formed by partly cutting out a Z'-direction-side portion of the edge portion 315a of the insertion port 315 of the shell body 310 and bending the cut-out portion to the inside of the insertion port 315 (to the Z-direction side).

Alternatively, the at least one second position restrictor of the invention may be configured similarly to the first position restrictors 320a' of any of the above aspects. The at least one second position restrictor may include an attaching portion and a restrictor body. The or each attaching portion is attached to a Z'-X-, or X'-direction-side portion of the edge portion of the shell body of any of the above aspects, and in other respects may be configured similarly to an attaching portion 321a' of an first position restrictor 320a' of any of the above aspects. The or each restrictor body may be a piece member extending from the corresponding attaching portion to the inside of the insertion port of the shell body, and may be configured similarly to a restrictor body 322a' of a first position restrictor 320a' of any of the above aspects.

The or each fifth position restrictor of the invention may be a piece member formed by partly cutting out the shell body of any of the above aspects and bending the cut-out portion to the inside of the shell body, and may be abuttable on the second face of the circuit board. For example, a pair of fifth position restrictors 320d' may be provided as piece members formed by cutting out an X-direction-side portion and an X'-direction-side portion of the shell body 310 (corresponding to a portion of a third plate 313 and a portion of a fourth plate 314, respectively in FIG. 13) and bending the cut-out portions in the X' and X directions, respectively, and may be abuttable on the second face 102 of the circuit board 100. Fourth openings are also formed around the respective fifth position restrictors 320d'.

The insulator of the invention is not limited to the above-described circuit board but may be an insulating resin body. Where the insulator is the body, the body may be configured to hold at least one terminal, which is contactable inside a shell body with a terminal or terminals of a mating connector. In this case, it is possible to omit the at least one electronic component of the invention. In any portion of the body, the face on the Z-direction side may serve as a first face, and the face on the Z direction side may serve as a second face. Even where a connector includes the above body in place of the circuit board may be manufactured by a manufacturing method of any of the above aspects. The at least one electronic component of the invention may be mounted on the insulator of any of the above aspects.

The connection structure of the invention may include the connector C1' in place of the connector C1. In other words, the connector C1' may also corresponds to the first connector of the invention.

The at least one half-lock spring of the invention is not required to be formed by cutting out the other shell. For example, the at least one half-lock spring may extend from an end in the Y direction of the other shell and be bent in the Y' direction to the inside of the other shell so as to be inserted into the other shell, or alternatively may extend from an end in the Y' direction of the other shell and be bent in the Y direction to the inside of the other shell so as to be inserted into the other shell.

The at least one grounding contact spring of the invention is not required to be formed by cutting out the one or other shell. The at least one grounding contact spring may extend from an end in the Y direction of the one or other shell and be bent in the Y' direction to the inside of the one or other shell so as to be inserted into the one or other shell, or may extend from an end in the Y' direction of the one or other shell and be bent in the Y direction to the inside of the one or other shell so as to be inserted into the one or other shell.

In the connection structure of the invention, the connector C1 or C1' may include a body and a plurality of terminals, in place of the circuit board 100. In this case, it may be configured such that at a fourth position P4, the half-lock springs 36 make elastic contact with a distal end of the one shell and substantially simultaneously the terminals 20 of the connector C2 make elastic contact with the terminals of the connector C1.

At least one latch arm and at least one engagement hole will suffice in the connection structure of the invention. Also, at least one first position restrictor will suffice in the connection structure of the invention, and the at least one first position restrictor may simply be a push-back portion to be connected to the at least one latch arm. The connection structure of the invention may be configured such that the at least one latch arm is not provided the connectors C1 and C1' of any of the above aspects but in the connector C2 of any of the above aspects, and that the at least one engagement hole is not provided in the connector C2 of any of the above aspects but in the connectors C1 and C1' of any of the above aspects. In this case, the engaging portion or portions of the at least one latch arm may preferably protrude to the inside of the connector C2. Also, the connection structure of the invention may be provided without the at least one latch arm, and instead provided only with the engaging portion or portions in the shell of the connector C1 or C1', or C2, of any of the above aspects. In this case, the or each engaging portion may be a piece member or the like formed by cutting out and bending the shell.

At least one half-lock spring and at least one lock portion will suffice in the invention. Also, at least one contact spring will suffice, and a plurality of them will also be obviously possible, in the invention. Also, at least one electrode will suffice in the invention for contacting with the terminals of the circuit board.

It should be noted that the materials, the shapes, the dimensions, the numbers, the positions, etc. of the elements of the shield shells, the connectors, the connection structure of connectors in the above-described embodiments and their variants are presented by way of example only and can be modified in any manner as long as the same functions can be fulfilled. The aspects and variants of the above-described embodiments can be combined in any possible manner.

REFERENCE SIGNS LIST

C, C1': connector (first connector)
100: circuit board (insulator)

101: first face
102: second face
110: electrode
120: fitting recess
130: electrode
200: electronic component
300: shield shell (first shield shell)
310: shell body
311: first plate
312: second plate
313: third plate
313a: first opening
313b: second opening
313c: third opening
314: fourth plate
314a: first opening
314b: second opening
314c: third opening
315: insertion port
315a: edge portion
316: connection port
320a: first position restrictor
320b, 320b': second position restrictor
320c: fourth position restrictor
320d, 320d': fifth position restrictor
330: latch arm
331: arm
332: engaging portion (third position restrictor)
333: operating portion (third position restrictor)
C2: connector (second connector)
10: body
11: base
12: tongue
20: terminal
21: contact portion
22: tail portion
23: intermediate portion
30: shield shell (second shield shell)
31: first plate
32: second plate
33: third plate
34: fourth plate
35: engagement hole
36: half-lock spring
37: grounding contact spring

What is claimed is:

1. A shield shell comprising:
a shell body including an insertion port and an edge portion of the insertion port, the insertion port opening to one side in a first direction, the shell body being configured to receive an insulator through the insertion port;
a first position restrictor provided at the edge portion of the shell body and located inside the insertion port;
a second position restrictor provided in the shell body so as to oppose the first position restrictor with a spacing therebetween in a second direction, the second direction being substantially orthogonal to the first direction; and
a latch arm, the latch arm including:
an arm extending from the first position restrictor, or from the edge portion of the shell body, to the other side in the first direction inside the shell body; and
a third position restrictor provided at the arm and at least partly located inside the shell body, wherein
a distance in the second direction from the first position restrictor to the second position restrictor is substantially equal to, or slightly larger than, a distance in the second direction from a first face to a second face of the insulator, the second face being an opposite face to the first face,
the first and second position restrictors are respectively abuttable on the first and second faces of the insulator when the insulator is inserted into the shell body through the insertion port, and
the third position restrictor is abuttable on the first face of the insulator inside the shell body when the insulator is inserted into the shell body through the insertion port.

2. The shield shell according to claim 1, wherein
the first position restrictor is a piece member extending from the edge portion of the shell body into the insertion port.

3. The shield shell according to claim 1, wherein
the first position restrictor includes:
an attaching portion attached to the edge portion of the shell body; and
a restrictor body being a piece member extending from the attaching portion into the insertion port.

4. The shield shell according to claim 1, wherein
the second position restrictor is a portion of the edge portion of the shell body that opposes the first position restrictor with a spacing therebetween in the second direction.

5. The shield shell according to claim 1, wherein
the second position restrictor is a piece member extending from the edge portion of the shell body into the insertion port.

6. The shield shell according to claim 1, wherein
the second position restrictor includes:
an attaching portion attached to the edge portion of the shell body; and
a restrictor body being a piece member extending from the attaching portion into the insertion port.

7. The shield shell according to claim 1, wherein
the shield shell further comprises a fourth position restrictor provided in the shell body, the fourth position restrictor being located inside the shell body and on the other side in the first direction with respect to the first position restrictor, and
the fourth position restrictor is abuttable on the first face of the insulator inside the shell body when the insulator is inserted into the shell body through the insertion port.

8. The shield shell according to claim 1, wherein
the shield shell further comprises a fifth position restrictor provided in the shell body, the fifth position restrictor being located on the other side in the first direction with respect to the second position restrictor, and
the fifth position restrictor is abuttable on the second face of the insulator inside the shell body when the insulator is inserted into the shell body through the insertion port.

9. A connector comprising:
at least one electronic component;
an insulator with the at least one electronic component mounted thereon; and
the shield shell according to claim 1, the shield shell housing the insulator.

10. A mating connector connectable to the connector according to claim 9, wherein
the mating connector comprises a second shield shell, the second shield shell being configured to receive a first shield shell in the first direction, the first shell being the shield shell of the connector,
the second shield shell includes an engagement hole and a half-lock spring, and when the first shield shell is inserted into the second shield shell, the third position restrictor of the latch arm fits into the engagement hole, and substantially simultaneously the half-lock spring is locked with a lock portion of the first shield shell.

11. The mating connector according to claim 10, wherein the second shield shell further includes a grounding contact spring,
while the first shield shell is being inserted into the second shield shell, the half-lock spring makes elastic contact with the first shield shell from when contacting the first shield shell until when locked with the lock portion,
the grounding contact spring is configured to make elastic contact with the first shield shell before the half-lock spring makes contact with the first shield shell, and
a load applied to the first shield shell when the grounding contact spring makes elastic contact with the first shield shell is smaller than a load applied to the first shield shell when the half-lock spring makes elastic contact with the first shield shell.

12. The mating connector according to claim 10, wherein the mating connector further comprises:
an insulative body housed in the second shield shell; and
at least one terminal held by the insulative body, and
the at least one terminal is configured to make elastic contact with the insulator housed in the first shield shell substantially at a same time as the half-lock spring makes elastic contact with the first shield shell.

13. A connection structure of connectors, the connection structure comprising:
a first connector; and
a second connector, wherein
one of the first and second connectors comprises one shield shell being the shield shell according to claim 1, and the other connector includes an other shield shell,
the one shield shell is insertable into the other shield shell in the first direction,
the one shield shell comprises a lock portion and an engaging portion,
the other shield shell comprises a half-lock spring and an engagement hole, and
when the one shield shell is inserted into the other shield shell, the engaging portion is inserted into the engagement hole, and substantially simultaneously the half-lock spring is locked with the lock portion.

14. The connection structure according to claim 13, wherein
the one or other shield shell further comprises a grounding contact spring,
while the one shield shell is being inserted into the other shield shell, the half-lock spring is in elastic contact with the one shield shell from when contacting the one shield shell until when locked with the lock portion,
the grounding contact spring is configured to come into elastic contact with the other shield shell or the one shield shell before the half-lock spring makes contact with the one shield shell, and
a load applied to the other shield shell when the grounding contact spring makes elastic contact with the other shield shell, or alternatively a load applied to the one shield shell when the grounding contact spring makes elastic contact with the one shield shell, is smaller than a load applied to the one shield shell when the half-lock spring makes elastic contact with the one shield shell.

15. The connection structure according to claim 13, wherein
the one connector further comprises an insulator housed in the one shield shell,
the other connector further comprises an insulative body housed in the other shield shell and at least one terminal held by the body, and
the at least one terminal is configured to make elastic contact with the insulator substantially at a same time as the half-lock spring makes elastic contact with the one shield shell.

16. The connection structure according to claim 13, wherein
the one connector further comprises an insulative body housed in the one shield shell and at least one terminal held by the body,
the other connector further comprises an insulative body housed in the other shield shell and at least one terminal held by the body, and
the at least one terminal inside the one shield shell is configured to make elastic contact with the at least one terminal inside the other shield shell substantially at a same time as the half-lock spring makes elastic contact with the one shield shell.

17. The connection structure according to claim 13, wherein
the one shield shell further comprises a latch arm, the latch arm including:
an arm extending from the first position restrictor, or from the edge portion of the shell body, to the other side in the first direction inside the shell body; and
a third position restrictor being the engaging portion of the one shield shell, the third position restrictor being provided at the arm and at least partly located inside the shell body,
the third position restrictor is abuttable on the first face of the insulator inside the shell body when the insulator is inserted into the shell body through the insertion port, and
the connection structure is configured to generate a sound by at least one of the following means:
insertion of the third position restrictor of the latch arm into the engagement hole;
or
locking of the half-lock spring with the lock portion.

18. A shield shell comprising:
a shell body including an insertion port and an edge portion of the insertion port, the insertion port opening to one side in a first direction, the shell body being configured to receive an insulator through the insertion port;
a first position restrictor provided at the edge portion of the shell body and located inside the insertion port;
a second position restrictor provided in the shell body so as to oppose the first position restrictor with a spacing therebetween in a second direction, the second direction being substantially orthogonal to the first direction; and
a fixing portion, the fixing portion being formed by cutting out a portion of the shell body on the other side in the first direction with respect to the first position restrictor and bending the cut-out portion to an inside of the shell body,
a distance in the second direction from the first position restrictor to the second position restrictor is substantially equal to, or slightly larger than, a distance in the second direction from a first face to a second face of the insulator, the second face being an opposite face to the first face, the first and second position restrictors are respectively abuttable on the first and second faces of the insulator when the insulator is inserted into the shell body through the insertion port, and the fixing portion is configured to fit into a fitting recess in the insulator.

19. A method for manufacturing a connector comprising:

preparing an insulator having a first face and a second face opposite to the first face;

preparing a shield shell including a shell body, a first position restrictor, a second position restrictor, and a latch arm, wherein the shell body includes an insertion port opening to one side in a first direction, the first position restrictor is provided at an edge portion of the insertion port of the shell body and located inside the insertion port, the second position restrictor is provided in the shell body so as to oppose the first position restrictor with a spacing therebetween in a second direction, the second direction is substantially orthogonal to the first direction, and the latch arm includes an arm extending from the first position restrictor, or from the edge portion of the shell body, to the other side in the first direction inside the shell body, and a third position restrictor provided at the arm and at least partly located inside the shell body; and inserting the insulator into the shell body through the insertion port while bringing the first and second position restrictors into abutment with the first and second faces, respectively, of the insulator, wherein the inserting of the insulator into the shell body includes bringing the third position restrictor into abutment with the first face of the insulator inside the shell body.

* * * * *